(12) United States Patent
Shimoju et al.

(10) Patent No.: US 11,899,361 B2
(45) Date of Patent: Feb. 13, 2024

(54) KIT, COMPOSITION FOR FORMING UNDERLAYER FILM FOR IMPRINTING, LAMINATE, AND PRODUCTION METHOD USING THE SAME

(71) Applicant: FUJIFILM Corporation, Tokyo (JP)

(72) Inventors: Naoya Shimoju, Haibara-gun (JP); Akinori Shibuya, Haibara-gun (JP); Yuichiro Goto, Haibara-gun (JP); Akihiro Hakamata, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 810 days.

(21) Appl. No.: 16/988,033

(22) Filed: Aug. 7, 2020

(65) Prior Publication Data

US 2020/0363718 A1 Nov. 19, 2020

Related U.S. Application Data

(63) Continuation of application No. PCT/JP2019/003767, filed on Feb. 4, 2019.

(30) Foreign Application Priority Data

Feb. 9, 2018 (JP) ................................. 2018-021872

(51) Int. Cl.
*G03F 7/00* (2006.01)
*C08F 220/28* (2006.01)
(Continued)

(52) U.S. Cl.
CPC ............ *G03F 7/0002* (2013.01); *B29C 59/02* (2013.01); *B29C 59/16* (2013.01);
(Continued)

(58) Field of Classification Search
CPC .......... G03F 7/0002; G03F 7/11; G03F 7/161; G03F 7/027; B29C 59/02; B29C 59/16;
(Continued)

(56) References Cited

U.S. PATENT DOCUMENTS

2010/0239889 A1* 9/2010 Uchida .................. B29C 43/40
264/494
2015/0322219 A1 11/2015 Someya et al.
(Continued)

FOREIGN PATENT DOCUMENTS

JP 2014-189616 A 10/2014
JP 2016-058663 A 4/2016
(Continued)

OTHER PUBLICATIONS

International Search Report dated May 7, 2019 from the International Searching Authority in International Application No. PCT/JP2019/003767.
(Continued)

*Primary Examiner* — Michael M. Robinson
(74) *Attorney, Agent, or Firm* — Sughrue Mion, PLLC

(57) ABSTRACT

Provided is a kit including a curable composition for imprinting which contains a polymerizable compound having an aromatic ring and a composition for forming an underlayer film for imprinting which contains a polymer and a solvent, in which the polymer contains at least one kind of specific constitutional unit and has a polymerizable group, a film formed of the composition for forming an underlayer film for imprinting is a solid film at 23° C., and a portion that has a continuous partial structure containing an aromatic ring which is included in the polymerizable compound and accounts for 60% by mass or more of the polymerizable compound is common to a continuous partial structure containing an aromatic ring which is included in a substituent R in a side chain in the polymer. Furthermore, the present invention relates to a composition for forming an underlayer film for imprinting which is used in combination with a curable composition for imprinting; a laminate; a method for producing a laminate; a method for producing a cured
(Continued)

product pattern; and a method for manufacturing a circuit board.

19 Claims, 2 Drawing Sheets

(51) Int. Cl.
*C08F 220/30* (2006.01)
*B29C 59/02* (2006.01)
*B29C 59/16* (2006.01)
*G03F 7/11* (2006.01)
*G03F 7/16* (2006.01)

(52) U.S. Cl.
CPC ...... *C08F 220/283* (2020.02); *C08F 220/303* (2020.02); *G03F 7/11* (2013.01); *G03F 7/161* (2013.01)

(58) Field of Classification Search
CPC .............. C08F 220/283; C08F 220/303; C08F 265/06; C08F 222/102; C08F 222/1025; C08F 222/1045; C08F 212/08; C08F 20/18; C08F 290/12; B32B 27/30; C09D 5/00; C09D 125/02; C09D 129/10; C09D 133/04; C09D 145/00; C09D 151/003; C09D 165/00; H01L 21/027

See application file for complete search history.

(56) References Cited

U.S. PATENT DOCUMENTS

| | | |
|---|---|---|
| 2016/0009945 A1 | 1/2016 | Enomoto et al. |
| 2016/0075124 A1 | 3/2016 | Tokue et al. |
| 2017/0285462 A1 | 10/2017 | Ito |
| 2017/0285465 A1 | 10/2017 | Iimura et al. |

FOREIGN PATENT DOCUMENTS

| | | |
|---|---|---|
| JP | 2017-199787 A | 11/2017 |
| WO | 2014/097993 A1 | 6/2014 |
| WO | 2016/152600 A1 | 9/2016 |
| WO | 2017/170631 A1 | 10/2017 |
| WO | 2017/170697 A1 | 10/2017 |

OTHER PUBLICATIONS

Written Opinion dated May 7, 2019 from the International Bureau in International Application No. PCT/JP2019/003767.

International Preliminary Report on Patentability dated Aug. 11, 2020 from the International Bureau in International Application No. PCT/JP2019/003767.

\* cited by examiner

FIG. 1G
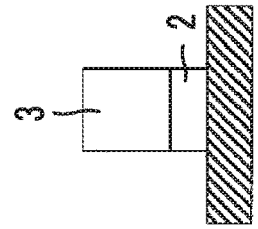
FIG. 1F
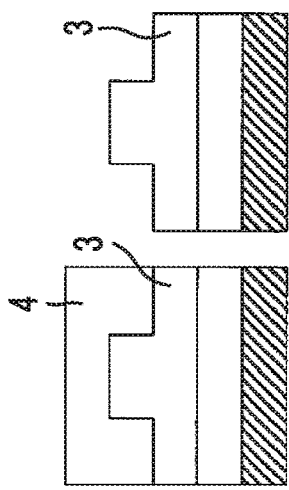
FIG. 1E
FIG. 1D
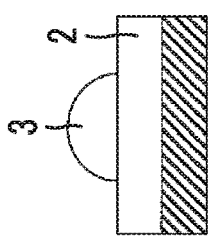
FIG. 1C
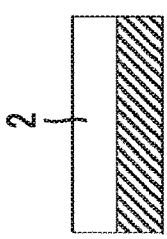
FIG. 1B
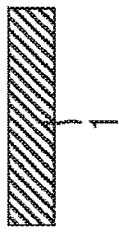
FIG. 1A

KIT, COMPOSITION FOR FORMING UNDERLAYER FILM FOR IMPRINTING, LAMINATE, AND PRODUCTION METHOD USING THE SAME

CROSS-REFERENCE TO RELATED APPLICATIONS

This application is a Continuation of PCT International Application No. PCT/JP2019/003767 filed on Feb. 4, 2019, which claims priority under 35 U.S.C § 119(a) to Japanese Patent Application No. 2018-021872 filed on Feb. 9, 2018. Each of the above application(s) is hereby expressly incorporated by reference, in its entirety, into the present application.

BACKGROUND OF THE INVENTION

1. Field of the Invention

The present invention relates to a kit, a composition for forming an underlayer film for imprinting, a laminate, and a production method using the same.

2. Description of the Related Art

An imprint method is a method in which a fine pattern is transferred by pressing a mold against a curable composition, curing the composition, and then peeling off the mold. An application of this method to a field of precision processing such as fabrication of a semiconductor integrated circuit is in progress. By the imprint method, an expensive fine processing device such as a stepper and an electron beam is not required, and thus a device structure is simple and a production cost is significantly reduced. Since the production cost is reduced, a process is simple, and high resolution and high throughput can be realized, an investigation for mass production of a device in various fields is being vigorously pursued.

In the imprint method, there is a technique in which a photosensitive resin composition is used as a material applied for patterning and processing is performed by combining a light-transmitting mold. In this production method, a pattern is formed on a cured film of the photosensitive resin composition disposed on a substrate by radiating light through a mold, and is used as an insulating member or as a mask for further processing. A method using ultraviolet rays (UV: Ultraviolet) as the light to be radiated is particularly called a UV nanoimprint method in some cases. In a photo-nanoimprint method including the UV nanoimprint method, unlike a thermal nanoimprint method in which a thermosetting resin composition is used and heating is required, processing at room temperature is possible. Therefore, the method can be widely used as a technique for realizing high quality in manufacture of a semiconductor device or the like in which heat is to be avoided.

In the photo-nanoimprint method using a photosensitive resin composition, a technique using an underlayer film has been proposed (JP2014-189616A). JP2014-189616A discloses a composition which is excellent in adhesiveness between a substrate and an imprint layer and includes a polymerizable compound, a first solvent, and a second solvent, and in which a boiling point of the first solvent at 1 atm is 160° C. or higher, a boiling point of the second solvent at 1 atm is lower than 160° C., and a content of the polymerizable compound in the composition is less than 1% by mass. Moreover, a compound having the following structure is described as a compound formulated in the composition.

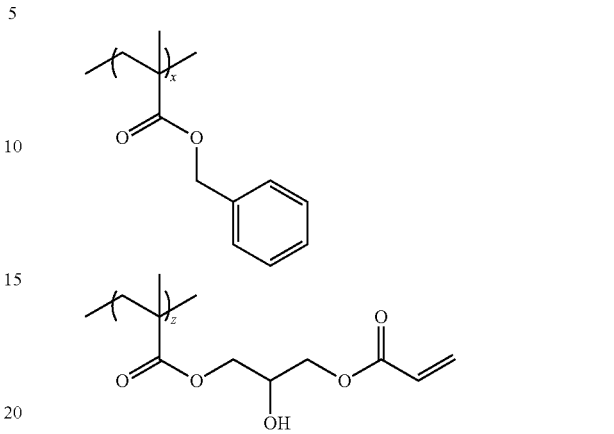

SUMMARY OF THE INVENTION

The composition described in JP2014-189616A is a composition which is excellent in the adhesiveness, but wettability of a curable composition for imprinting with respect to a coating film of a composition for forming an underlayer film for imprinting has not been investigated.

An object of the present invention is to provide a kit which is excellent in both wettability and adhesiveness of a curable composition for imprinting with respect to a coating film of a composition for forming an underlayer film for imprinting and includes the curable composition for imprinting and the composition for forming an underlayer film for imprinting; a composition for forming an underlayer film for imprinting which is used in combination with a curable composition for imprinting; a laminate; a method for producing a laminate; a method for producing a cured product pattern; and a method for manufacturing a circuit board.

Under the above object, the present inventors have considered that in the photo-nanoimprint method using a combination of a curable composition for imprinting and a composition for forming an underlayer film for imprinting, it is important to properly select a combination of formulation components of the both compositions rather than to develop the both compositions alone. Moreover, the present inventors have found that the above object can be achieved by selecting a specific polymer as a polymer contained in the composition for forming an underlayer film for imprinting, and making a partial structure of the polymer and a partial structure of a polymerizable compound contained in the curable composition for imprinting have commonality. Specifically, the above object has been achieved by a unit according to the following <1> and units according to <2> to <19> which are preferred embodiments.

<1> A kit comprising: a curable composition for imprinting which contains a polymerizable compound having an aromatic ring; and a composition for forming an underlayer film for imprinting which contains a polymer and a solvent, in which the polymer contains at least one kind of constitutional unit represented by any one of Formulae (1) to (6) and has a polymerizable group, a film formed of the composition for forming an underlayer film for imprinting is a solid film at 23° C., and a continuous partial structure containing an aromatic ring which is included in the polymerizable compound and accounts for 60% by mass or more of the polymerizable compound is common to a continuous partial structure containing an aromatic ring which is included in a substituent R in Formulae (1) to (6),

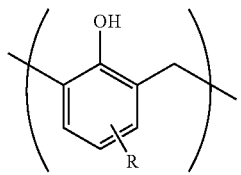
(1)

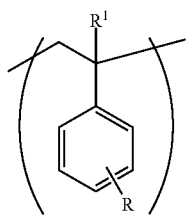
(2)

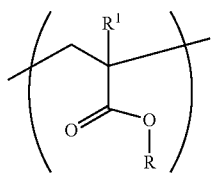
(3)

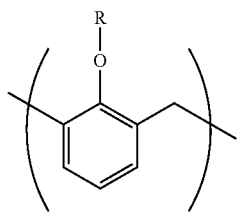
(4)

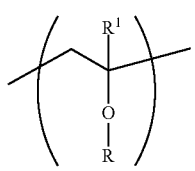
(5)

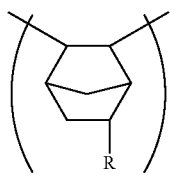
(6)

in Formulae (1) to (6), the substituents R are each independently a substituent having a partial structure containing an aromatic ring, a formula weight of R is 80 or more, a substituent $R^1$ is a hydrogen atom or a methyl group, and a main chain of the polymer in Formulae (1) to (6) may have a substituent.

<2> The kit as described in <1>, in which the following ΔHSP, which is derived from a Hansen solubility parameter of at least one kind of polymerizable compound contained in the curable composition for imprinting and a Hansen solubility parameter of the continuous partial structure containing an aromatic ring which is included in the substituent R of the polymer, is 5 or less, $$\Delta HSP = [4.0 \times (\Delta d^2 + \Delta p^2 + \Delta h^2)]^{0.5}$$

where Δd is a difference between a dispersion element component of a Hansen solubility parameter vector of the polymerizable compound and a dispersion element component of a Hansen solubility parameter vector of the continuous partial structure containing an aromatic ring which is included in the substituent R of the polymer, Δp is a difference between a polarity element component of the Hansen solubility parameter vector of the polymerizable compound and a polarity element component of the Hansen solubility parameter vector of the continuous partial structure containing an aromatic ring which is included in the substituent R of the polymer, and Δh is a difference between a hydrogen bond element component of the Hansen solubility parameter vector of the polymerizable compound and a hydrogen bond element component of the Hansen solubility parameter vector of the continuous partial structure containing an aromatic ring which is included in the substituent R of the polymer.

<3> The kit as described in <1> or <2>, in which a formula weight of the continuous partial structure containing an aromatic ring which is included in the substituent R of the polymer is 500 or less.

<4> The kit as described in any one of <1> to <3>, in which the polymerizable group included in the polymer is a (meth)acryloyl group.

<5> The kit as described in any one of <1> to <4>, in which surface free energy of an underlayer film for imprinting formed of the composition for forming an underlayer film for imprinting is 40 mN/m or more.

<6> The kit as described in any one of <1> to <5>, in which in the polymer, the continuous partial structure containing an aromatic ring which is included in the substituent R in Formulae (1) to (6) includes a polymerizable group.

<7> The kit as described in any one of <1> to <6>, in which the continuous partial structure containing an aromatic ring which is included in the substituent R of the polymer is a substituent represented by $-(L^1)_{n1}-La-[(L^2)_{n2}-(P)_{n3}]_{n4}$, where $L^1$ and $L^2$ are each independently a linking group containing a heteroatom, provided that in a case where n3 is 0, $L^2$ is a substituent containing a heteroatom; La is a linking group containing an aromatic ring, provided that in a case where n2 is 0 and n3 is 0, La is a substituent containing an aromatic ring; P is a polymerizable group; n1 is 0 to 4; n2 is 0 to 4; n3 is 0 to 6; and n4 is an integer of 1 to 10.

<8> The kit as described in any one of <1> to <7>, in which the polymer is a copolymer having the other constitutional unit different from the constitutional unit having the substituent R, which is represented by any one of Formulae (1) to (6).

<9> The kit as described in <8>, in which the other constitutional unit of the polymer is represented by any one of Formulae (1-1) to (1-6),

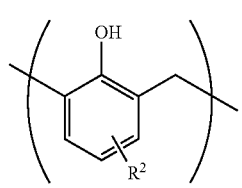
(1-1)

-continued (1-2)
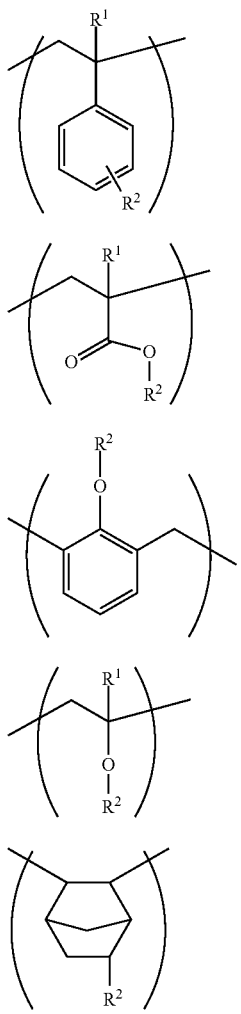

(1-3)

(1-4)

(1-5)

(1-6)

in Formulae (1-1) to (1-6), substituents $R^2$ are each independently a substituent having a polymerizable group, a substituent $R^1$ is a hydrogen atom or a methyl group, and a main chain of the polymer in Formulae (1-1) to (1-6) may have a substituent.

<10> The kit as described in <8> or <9>, in which the constitutional unit having the substituent R has a polymerizable group, and the number of linking atoms between a carbon-carbon unsaturated bond of the polymerizable group and the main chain is larger than the number of linking atoms between a carbon-carbon unsaturated bond of a polymerizable group and a main chain in the other constitutional unit.

<11> The kit as described in any one of <1> to <10>, in which the formula weight of the substituent R is 500 or less.

<12> A composition for forming an underlayer film for imprinting, which is used in combination with a curable composition for imprinting that contains a polymerizable compound having an aromatic ring, the composition comprising: the polymer which contains at least one kind of constitutional unit represented by any one of Formulae (1) to (6) and has a polymerizable group, in which a film formed of the composition for forming an underlayer film for imprinting is a solid film at 23° C., and 60% by mass or more of a continuous partial structure containing an aromatic ring which is included in the polymerizable compound is common to a continuous partial structure containing an aromatic ring which is included in a substituent R in Formulae (1) to (6), (1)
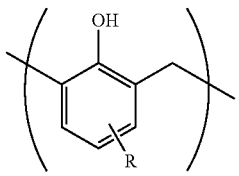

(2)
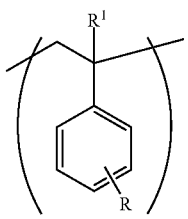

(3)
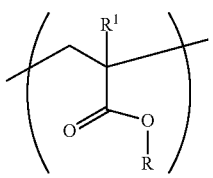

(4)
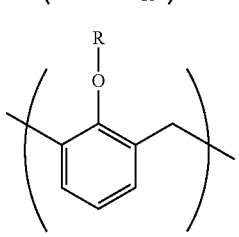

(5)
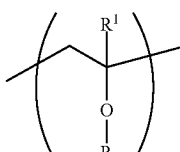

(6)
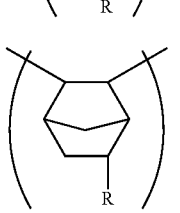

in Formulae (1) to (6), a formula weight of R is 80 or more, the substituents R are each independently a substituent having a partial structure containing an aromatic ring, a substituent $R^1$ is a hydrogen atom or a methyl group, and a main chain of the polymer in Formulae (1) to (6) may have a substituent.

<13> The composition for forming an underlayer film for imprinting as described in <12>, in which the continuous partial structure containing an aromatic ring which is included in the substituent R of the polymer is a substituent represented by $-(L^1)_{n1}-La-[(L^2)_{n2}-(P)_{n3}]_{n4}$, where $L^1$ and $L^2$ are each independently a linking group containing a heteroatom, provided that in a case where n3 is 0, $L^2$ is a substituent containing a heteroatom; La is a linking group containing an aromatic ring, provided that in a case where n2 is 0 and n3 is 0, La is a substituent containing an aromatic ring; P is a polymerizable group; n1 is 0 to 4; n2 is 0 to 4; n3 is 0 to 6; and n4 is an integer of 1 to 10.

<14> A laminate, which is formed from the kit as described in any one of <1> to <11>, comprising: an underlayer film formed of the composition for forming an underlayer film for imprinting; and an imprint layer which is formed of the curable composition for imprinting and is positioned on a surface of the underlayer film.

<15> A kit for producing a laminate using the kit as described in any one of <1> to <11>, the method comprising applying a curable composition for imprinting onto a surface of an underlayer film formed of the composition for forming an underlayer film for imprinting.

<16> The method for producing a laminate as described in <15>, in which the curable composition for imprinting is applied onto the surface of the underlayer film by an ink jet method.

<17> The method for producing a laminate as described in <15> or <16>, further comprising: a step of applying the composition for forming an underlayer film for imprinting in a layer form onto a substrate; and heating the composition for forming an underlayer film for imprinting applied in a layer form at 40° C. to 70° C.

<18> A method for producing a cured product pattern using the kit as described in any one of <1> to <11>, the method comprising: an underlayer film formation step of applying a composition for forming an underlayer film for imprinting onto a substrate to form an underlayer film; an application step of applying a curable composition for imprinting onto a surface of the underlayer film; a mold contact step of bringing the curable composition for imprinting into contact with a mold having a pattern for transferring a pattern shape; a light irradiation step of irradiating the curable composition for imprinting with light to form a cured product; and a release step of separating the mold from the cured product.

<19> A method for manufacturing a circuit board, comprising a step of obtaining a cured product pattern by the production method as described in <18>.

According to the present invention, it is possible to provide a kit which is excellent in wettability and adhesiveness of a curable composition for imprinting with respect to a composition for forming an underlayer film for imprinting; a composition for forming an underlayer film for imprinting; a laminate; a method for producing a laminate; a method for producing a cured product pattern; and a method for manufacturing a circuit board.

BRIEF DESCRIPTION OF THE DRAWINGS

FIGS. 1A to 1G are step explanatory diagrams showing an example of formation of a cured product pattern and a production process in a case where the obtained cured product pattern is used for processing of a substrate by etching.

DESCRIPTION OF THE PREFERRED EMBODIMENTS

Figure 2:
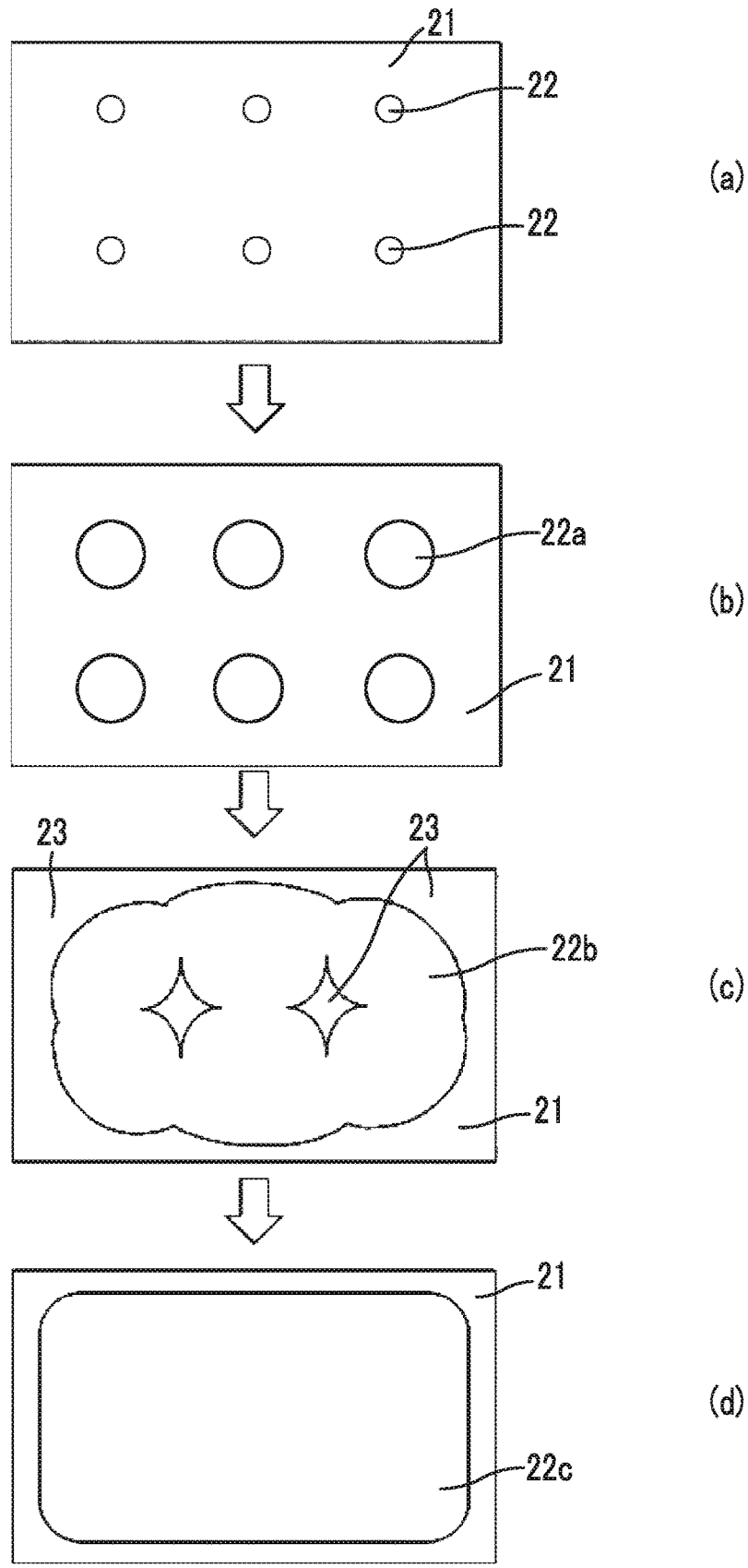
FIG. 2 is a plan view schematically showing a state of wet spreading of a curable composition for imprinting in a case where the curable composition for imprinting is applied onto a surface of an underlayer film having low wettability by an ink jet method.

Hereinafter, contents of the present invention will be described in detail. Moreover, in the present specification, "to" is used to mean that the preceding and succeeding numerical values of "to" are included as a lower limit value and an upper limit value, respectively.

In the present specification, "(meth)acrylate" represents acrylate and methacrylate.

In the present specification, "imprint" preferably refers to transfer of a pattern with a size of 1 nm to 10 mm, and more preferably refers to transfer (nanoimprint) of a pattern with a size of about 10 nm to 100 μm.

In descriptions of a group (atomic group) in the present specification, in a case where the group is described without specifying whether the group is substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

In the present specification, "light" includes not only light having a wavelength in an ultraviolet, near-ultraviolet, far-ultraviolet, visible, or infrared range, or an electromagnetic wave but also radiation. Examples of the radiation include a microwave, an electron beam, an extreme ultraviolet ray (EUV), and an X-ray. Moreover, laser light such as a 248-nm excimer laser, a 193-nm excimer laser, and a 172-nm excimer laser can also be used. The light may be monochromatic light (single-wavelength light) passing through an optical filter, or may be light (composite light) having a plurality of different wavelengths.

A temperature in the present invention is 23° C. unless otherwise specified.

A boiling point in the present invention refers to a boiling point at 1 atm (1 atm=1013.25 hPa).

A kit according to an embodiment of the present invention includes: a curable composition for imprinting which contains a polymerizable compound having an aromatic ring; and a composition for forming an underlayer film for imprinting which contains a polymer (hereinafter, the polymer is referred to as a "specific polymer" in some cases) and a solvent, in which the polymer contains at least one kind of constitutional unit represented by any one of Formulae (1) to (6) and has a polymerizable group, a film formed of the composition for forming an underlayer film for imprinting is a solid film at 23° C., and a continuous partial structure (hereinafter, this is referred to as a "partial structure B" in some cases) containing an aromatic ring which is included in the polymerizable compound and accounts for 60% by mass or more of the polymerizable compound is common to a continuous partial structure containing an aromatic ring which is included in a substituent R in Formulae (1) to (6).

Thereby, a kit which is excellent in wettability and adhesiveness between films used in an imprint method is obtained. The reason is presumed as follows.

In order to achieve the above performance, it is considered that reducing γL/S (interfacial tension) between an underlayer film formed of a composition for forming an underlayer film for imprinting and a curable composition for imprinting which forms an upper layer is effective. In order to reduce the interfacial tension, it can be said that reducing a difference between Hansen solubility parameter (HSP) values of the underlayer film which is a solid and the curable composition which is a liquid is effective. Therefore, in order to reduce the difference in HSP, it is presumed that a case where a partial structure of a component affecting HSP of the underlayer film which is a solid and a partial structure of a component affecting HSP of the curable composition which is a liquid are common is effective.

According to the following formula, in order to reduce the interfacial tension between a coating film (underlayer film) of the composition for forming an underlayer film for imprinting, which serves as an underlayer, and the curable composition for imprinting which forms an upper layer, it is effective that a partial structure of a polymer in the underlayer film which is a solid and a partial structure of the curable composition which is a liquid are common at a certain ratio or more. Furthermore, in a case where the structures are all the same, the interfacial tension becomes 0.

In the present invention, a continuous partial structure containing an aromatic ring which is included in the polymerizable compound and accounts for 60% by mass or more of the polymerizable compound is common to the partial structure B included in the specific polymer, but the common ratio is preferably 65% by mass or more, more preferably 70% by mass or more, still more preferably 75% by mass or more, even more preferably 80% by mass or more, further still more preferably 85% by mass or more, and particularly preferably 90% by mass or more of the polymerizable compound. The upper limit is 100% by mass or less.

Here, a continuous partial structure containing an aromatic ring, which is included in the polymerizable compound, refers to the largest partial structure which is common to the structure (for example, the following portion surrounded by a dotted line) included in R of the specific polymer and in which atoms are linked to each other. Here, as for the continuous partial structure, even in a case where another molecule or a substituent is bonded to a continuous moiety, as long as continuous moieties are common, the structure can be said to be a continuous partial structure. That is, it can be said that an oxygen atom represented by 1 in the following polymerizable compound A-3 and an oxygen atom represented by 1 in a resin G-1 are common. Similarly, it can be said that a carbon atom 2 in the polymerizable compound A-3 and a carbon atom 2 in the resin G-1 also have a common structure. All moieties other than a hydrogen atom surrounded by a dotted circle in the polymerizable compound A-3 are common to moieties other than a hydroxyl group bonded to the carbon atom 2 of a polymer G-1 in the partial structure of the resin G-1, and the common moiety corresponds to the partial structure B.

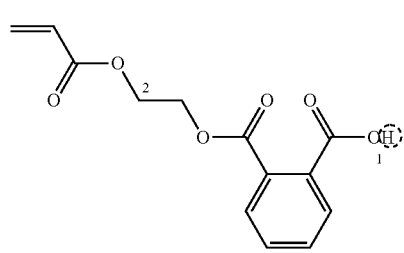

A-3

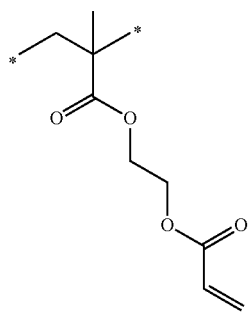

G-1

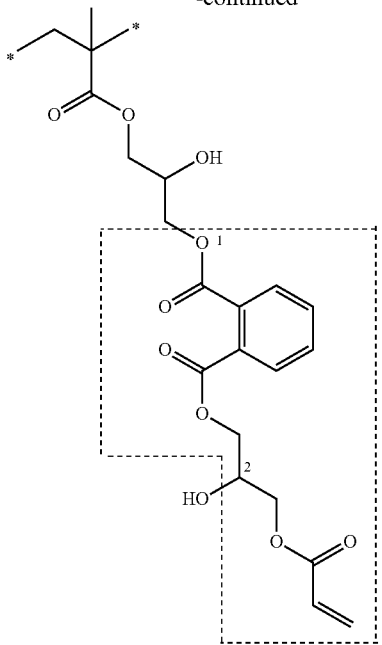

A common structure of this structure can be evaluated by a formula weight included in the partial structure. That is, with the partial structure B in Formulae (1) to (6) included in the composition for forming an underlayer film for imprinting and the polymerizable compound contained in the curable composition for imprinting, the evaluation can be performed by a ratio of the formula weights. This is expressed by Expression 1. In a case where a plurality of the corresponding components are present in the composition for forming an underlayer film for imprinting and the curable composition for imprinting, at least one kind of polymerizable compound having an aromatic ring which is contained in the curable composition for imprinting may have a structure common to at least one kind of specific polymer at 60% by mass or more.

"Formula weight of partial structure"/"molecular weight of polymerizable compound"×100  [Expression 1]

A formula weight of the partial structure B included in the substituent R in Formulae (1) to (6) included in the composition for forming an underlayer film for imprinting is preferably 1,000 or less, more preferably 750 or less, still more preferably 600 or less, even more preferably 500 or less, further still more preferably 450 or less, and further even more preferably 400 or less. The lower limit value is preferably 60 or more, more preferably 80 or more, and still more preferably 100 or more, and may be 150 or more.

<Composition for Forming Underlayer Film for Imprinting>

The composition for forming underlayer film for imprinting contains a polymer and a solvent.

<<Specific Polymer (Resin)>>

The composition for forming an underlayer film for imprinting according to the embodiment of the present invention contains a specific polymer. The specific polymer contains at least one kind of constitutional unit represented by any one of Formulae (1) to (6).

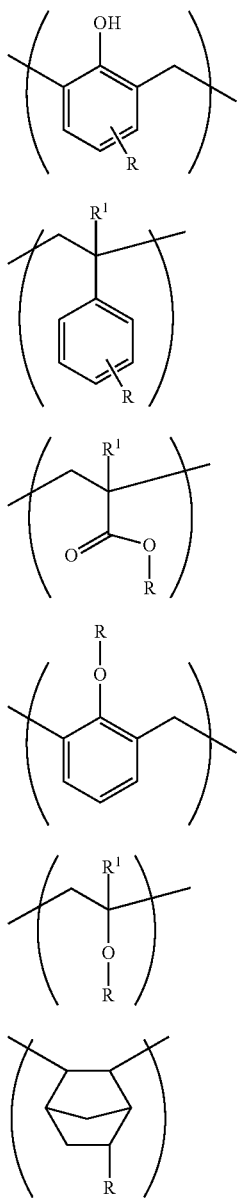

(1)
(2)
(3)
(4)
(5)
(6)

In Formulae (1) to (6), the substituents R are each independently a substituent having a partial structure containing an aromatic ring, and $R^1$ is a hydrogen atom or a methyl group. In the present specification, in the constitutional units represented by Formulae (1) to (6), a moiety other than R is a main chain of the specific polymer. In Formulae (1) to (6), the main chain and the substituent R may or may not have a substituent T described later as long as the effects of the present invention are exhibited. Moreover, R or the substituent T may be bonded to the main chain to form a ring.

The formula weight of the substituent R is 80 or more, preferably 100 or more, more preferably 130 or more, and still more preferably 150 or more. The upper limit is practically 500 or less.

In the present invention, each of the polymers has the partial structure B included in the substituent R. That is, the specific polymer has the substituent R, and the substituent R has the partial structure B. Here, the partial structure B may be the substituent R. The partial structure B may have a polymerizable group. Examples of the polymerizable group include examples of a polymerizable group P described later.

The number of carbon atoms in the aromatic ring contained in the partial structure B is preferably 2 to 22, more preferably 3 to 18, and still more preferably 3 to 10. In the present specification, the term "aromatic ring" is meant to include a structure in which a plurality of aromatic rings are linked to each other via or without via a linking group L described in detail later.

Specific examples of the aromatic ring in a case where the aromatic ring is an aromatic hydrocarbon ring include a benzene ring, a naphthalene ring, an anthracene ring, a phenanthrene ring, a phenalene ring, a fluorene ring, an acenaphthylene ring, a biphenyl ring, a terphenyl ring, an indene ring, an indane ring, a triphenylene ring, a tetraphenylene ring, a pyrene ring, a chrysene ring, a perylene ring, and a tetrahydronaphthalene ring. The aromatic hydrocarbon ring may have a structure in which a plurality of rings are linked to each other via or without via the linking group L, and examples thereof include a biphenyl ring, a diphenylmethane ring, and a triphenylmethane ring. Alternatively, examples of the structure in which a plurality of benzene rings are linked to each other, including some exemplified rings, include structures represented by Formulae Ar1 to Ar5. In the formulae, a straight line drawn outward from the vicinity of the center of the benzene ring indicates a bond. This bond is preferably bonded to $L^1$, $L^2$, or P in Formula (T1) or the main chain of the polymer, via or without via any linking group.

In the following formulae, $A^1$ is a divalent linking group, examples of the linking group L are preferable, and an alkylene group (the number of the carbon atoms is preferably 1 to 12, more preferably 1 to 6, and still more preferably 1 to 3) which may be substituted with a fluorine atom, a carbonyl group, an oxygen atom, a sulfonyl group, a sulfinyl group, —$NR^N$—, and —$C(R^B)_2$— ($R^B$ is an alkyl group (the number of the carbon atoms is preferably 1 to 12, more preferably 1 to 6, and still more preferably 1 to 3) which may be substituted with a fluorine atom, or an aryl group (the number of the carbon atoms is preferably 6 to 22, more preferably 6 to 18, and still more preferably 6 to 10, and the aryl groups may be bonded to each other via or without via the linking group L to form a ring)) is preferable. $A^2$ represents a nitrogen atom, a trivalent linking group containing a phosphorus atom, or a methine group which may be substituted (examples of the substituent include examples of the substituent T, and for example, an aryl group is mentioned). In Formulae Ar1 to Ar5, two or three bonds are optionally shown, but this means that bonding may be performed at a necessary moiety according to a necessary number of linkages. For example, an aspect in which two bonds are extended from one benzene ring can also be mentioned as a preferred aspect of the present invention. Moreover, an aspect in which Ar2 having three rings is a divalent linking group can also be mentioned as the preferred aspect of the present invention.

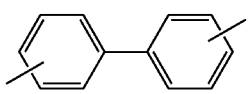

Ar1

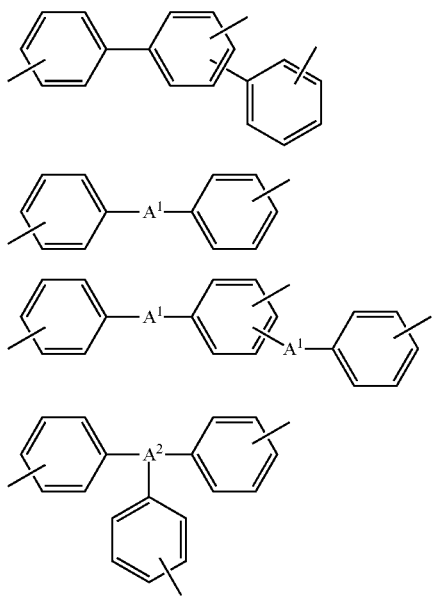

The examples of the aromatic hydrocarbon ring exemplified herein, including structures represented by the above chemical formulae, are called a ring aCy.

In a case where the aromatic ring is an aromatic heterocycle, the number of carbon atoms is preferably 1 to 12, more preferably 1 to 6, and still more preferably 1 to 5. Specific examples thereof include a thiophene ring, a furan ring, a pyrrole ring, an imidazole ring, a pyrazole ring, a triazole ring, a tetrazole ring, a thiazole ring, an oxazole ring, a pyridine ring, a pyrazine ring, a pyrimidine ring, a pyridazine ring, a triazine ring, an isoindole ring, an indole ring, an indazole ring, a purine ring, a quinolizine ring, an isoquinoline ring, a quinoline ring, a phthalazine ring, a naphthyridine ring, a quinoxaline ring, a quinazoline ring, a cinnoline ring, a carbazole ring, an acridine ring, a phenazine ring, a phenothiazine ring, and a phenoxazine ring.

The aromatic heterocycle may have a structure in which a plurality of ring structures are linked to each other via or without via the linking group L.

Hereinafter, the aromatic heterocycles shown here are referred to as a ring hCy.

As the aromatic ring in the specific polymer, particularly in the present invention, a benzene ring, a terphenyl ring, a ring of Ar3, a thiophene ring, a furan ring, a pyrrole ring, an oxazole ring, a triazine ring, and a thiazole ring are preferable.

In addition, the specific polymer may have the substituent T as long as the effects of the present invention are exhibited. A ring may be formed by bonding the substituents T to each other in a case where a plurality of the substituents T are present, or by bonding the substituent T to a ring in the formula via or without via the linking group L described in detail later.

In the specific polymer, preferably 3% by mass or more, more preferably 5% by mass or more, still more preferably 7% by mass or more, even more preferably 10% by mass or more, and further still more preferably 15% by mass or more of the partial structure B is an aromatic ring. The upper limit is not particularly limited, but is practically 90% by mass or less.

The substituent R of the specific polymer preferably has a substituent represented by Formula (T1). In terms of a relationship with the partial structure B, the partial structure B is preferably -(L)$_{n1}$-La-[(L$^2$)$_{n2}$-(P)$_{n3}$]$_{n4}$ in Formula (T1).

$$-(L^3)_{n5}-(L^1)_{n1}-La-[(L^2)_{n2}-(P)_{n3}]_{n4} \quad (T1)$$

L$^1$ and L$^2$ are each independently the following linking group L, and preferably a linking group Lh containing a heteroatom. Provided that in a case where n3 is 0, L$^2$ at a terminal is a substituent. La is a linking group containing an aromatic ring. Provided that in a case where n2 is 0 and n3 is 0, La is a substituent containing an aromatic ring. P is a polymerizable group. n1 is 0 to 4. n2 is 0 to 4. In a case where n1 or n2 is 2 or more, a plurality of linking groups L$^1$ or L$^2$ may be the same as or different from each other. n3 is 0 to 6. In a case where n3 is 2 or more, the linking group L$^2$ may be a tri- or higher valent linking group, and examples thereof include a linking group containing a group having an alkane structure (the number of the carbon atoms is preferably 1 to 12, more preferably 1 to 6, and still more preferably 1 to 3), a group having an alkene structure (the number of the carbon atoms is preferably 2 to 12, more preferably 2 to 6, and still more preferably 2 or 3), or a group having an aryl structure (the number of the carbon atoms is preferably 6 to 22, more preferably 6 to 18, and still more preferably 6 to 10), which has a valence of 3 or more. n4 is an integer of 1 to 10, preferably an integer of 1 to 8, more preferably an integer of 1 to 6, still more preferably an integer of 1 to 4, and particularly preferably an integer of 1 to 3. L$^3$ is a divalent linking group and is preferably the linking group L described in detail later. n5 is 0 or 1.

Two or more "(L$^1$)$_{n1}$-La-[(L$^2$)$_{n2}$-(P)$_{n3}$]$_{n4}$"'s may be substituted via L$^3$. That is, a form of -(L$^3$)$_{n5}$-{(L$^1$)$_{n1}$-La-[(L$^2$)$_{b2}$-(P)$_{n3}$]$_{n4}$}$_{n11}$ (n11 is an integer of 2 or more) can also be mentioned as the preferred aspect of the present invention. At this time, L$^3$ may be a tri- or higher valent linking group, and examples thereof include a linking group containing a group having an alkane structure (the number of the carbon atoms is preferably 1 to 12, more preferably 1 to 6, and still more preferably 1 to 3), a group having an alkene structure (the number of the carbon atoms is preferably 2 to 12, more preferably 2 to 6, and still more preferably 2 or 3), or a group having an aryl structure (the number of the carbon atoms is preferably 6 to 22, more preferably 6 to 18, and still more preferably 6 to 10), which has a valence of 3 or more.

Examples of the linking group Lh containing a heteroatom include an oxygen atom, a sulfur atom, a carbonyl group, a thiocarbonyl group, a sulfonyl group, a sulfinyl group, —NR$^N$—, an (oligo)alkyleneoxy group (the number of carbon atoms in an alkylene group in one constitutional unit is preferably 1 to 12, more preferably 1 to 6, and still more preferably 1 to 3; and the number of repetitions is preferably 1 to 50, more preferably 1 to 40, and still more preferably 1 to 30), or a linking group consisting of a combination thereof. The number of atoms, excluding a hydrogen atom, constituting the linking group Lh containing a heteroatom is preferably 1 to 100, more preferably 1 to 70, and particularly preferably 1 to 50. The number of linking atoms of Lh is preferably 1 to 25, more preferably 1 to 20, still more preferably 1 to 15, and even more preferably 1 to 10. Furthermore, the (oligo)alkyleneoxy group may be an alkyleneoxy group or an oligoalkyleneoxy group. The (oligo)alkyleneoxy group or the like may be chain-like or cyclic, or may be linear or branched. In a case where the linking group is a group capable of forming a salt, such as a case where —NR$^N$— or a carboxyl group is substituted, the group may form a salt.

$L^1$ and $L^2$ may each independently have the substituent T. For example, an aspect in which a hydroxyl group is substituted for an alkylene group moiety of the alkyleneoxy group can be mentioned as a preferred example.

In a case where n3 is 0 and $L^2$ is a substituent, an atom or an atomic group at a position of P may be any atom or any atomic group, and examples thereof include a hydrogen atom and an alkyl group (the number of the carbon atoms is preferably 1 to 12, more preferably 1 to 6, and still more preferably 1 to 3).

Examples of the polymerizable group represented by P include a polymerizable group Ps of a polymer described later, and preferred ranges thereof are also the same. Among them, P is preferably a (meth)acryloyl group.

La is a linking group containing an aromatic ring. La may be constituted of only an aromatic ring, or may have a non-aromatic hydrocarbon linking group. Provided that preferably 15% by mass or more, more preferably 20% by mass or more, still more preferably 30% by mass or more, even more preferably 40% by mass or more, and further still more preferably 50% by mass or more of La is an aromatic ring. The upper limit is not particularly limited, but the aromatic ring may account for 100% by mass of La. Examples of the non-aromatic hydrocarbon linking group include non-aromatic hydrocarbon linking groups among the linking groups L described in detail later, and include an alkylene group (the number of the carbon atoms is preferably 1 to 24, more preferably 1 to 12, and still more preferably 1 to 6) which may be chain-like or cyclic, or may be linear or branched and an alkenylene group (the number of the carbon atoms is preferably 2 to 24, more preferably 2 to 12, and still more preferably 2 to 6) which may be chain-like or cyclic, or may be linear or branched. The non-aromatic hydrocarbon linking groups shown here are called a linking group Lt.

In a case where n2 is 0 and n3 is 0, the aromatic ring La becomes a substituent at a terminal. In this case, any atom or any atomic group may be at the terminal, and examples thereof include a hydrogen atom and an alkyl group (the number of the carbon atoms is preferably 1 to 12, more preferably 1 to 6, and still more preferably 1 to 3). The aromatic ring in La has a structure in which a plurality of rings are linked to each other via or without via the linking group L described in detail later (for example, a ring structure represented by Formulae Ar1 to Ar5).

Examples of the aromatic ring in La include examples of the aromatic hydrocarbon ring aCy and the aromatic heterocycle hCy, and preferred examples thereof are also the same.

La may be a linking group containing an aromatic ring, and may have a form in which the aromatic ring is not at a linking position. For example, a form in which an alkylene group is bonded between $L^1$ and $L^2$, and the alkylene group is substituted with an aromatic ring may be used.

The substituent represented by Formula (T1) is preferably bonded directly to or bonded via the linking group L described in detail later to the constitutional units represented by Formulae (1) to (6), and more preferably bonded directly to the constitutional units. Among the linking groups L, in this case, an alkylene group, an alkenylene group, $-NR^N-$, a carbonyl group, an oxygen atom, an (oligo)alkyleneoxy group, or a group consisting of a combination thereof is preferable. At this time, the number of linking atoms is preferably 1 to 25 and more preferably 1 to 15. The number of atoms (excluding a hydrogen atom) constituting the linking group is preferably 1 to 60, more preferably 1 to 40, and still more preferably 1 to 20. At this time, the linking group L may further have a substituent T. For example, an aspect in which a hydroxyl group is substituted for an alkylene group moiety forming the linking group L can be mentioned as a preferred example.

Examples of the substituent T include an alkyl group (the number of the carbon atoms is preferably 1 to 24, more preferably 1 to 12, and still more preferably 1 to 6), an arylalkyl group (the number of the carbon atoms is preferably 7 to 21, more preferably 7 to 15, and still more preferably 7 to 11), an alkenyl group (the number of the carbon atoms is preferably 2 to 24, more preferably 2 to 12, and still more preferably 2 to 6), an alkynyl group (the number of the carbon atoms is preferably 2 to 12, more preferably 2 to 6, and still more preferably 2 or 3), a hydroxyl group, an amino group (the number of the carbon atoms is preferably 0 to 24, more preferably 0 to 12, and still more preferably 0 to 6), a thiol group, a carboxyl group, an aryl group (the number of the carbon atoms is preferably 6 to 22, more preferably 6 to 18, and still more preferably 6 to 10), an alkoxyl group (the number of the carbon atoms is preferably 1 to 12, more preferably 1 to 6, and still more preferably 1 to 3), an aryloxy group (the number of the carbon atoms is preferably 6 to 22, more preferably 6 to 18, and still more preferably 6 to 10), an acyl group (the number of the carbon atoms is preferably 2 to 12, more preferably 2 to 6, and still more preferably 2 or 3), an acyloxy group (the number of the carbon atoms is preferably 2 to 12, more preferably 2 to 6, and still more preferably 2 or 3), an aryloyl group (the number of the carbon atoms is preferably 7 to 23, more preferably 7 to 19, and still more preferably 7 to 11), an aryloyloxy group (the number of the carbon atoms is preferably 7 to 23, more preferably 7 to 19, and still more preferably 7 to 11), a carbamoyl group (the number of the carbon atoms is preferably 1 to 12, more preferably 1 to 6, and still more preferably 1 to 3), a sulfamoyl group (the number of the carbon atoms is preferably 0 to 12, more preferably 0 to 6, and still more preferably 0 to 3), a sulfo group, an alkylsulfonyl group (the number of the carbon atoms is preferably 1 to 12, more preferably 1 to 6, and still more preferably 1 to 3), an arylsulfonyl group (the number of the carbon atoms is preferably 6 to 22, more preferably 6 to 18, and still more preferably 6 to 10), a heterocyclic group (the number of the carbon atoms is preferably 1 to 12, more preferably 1 to 8, and still more preferably 2 to 5, and a 5-membered ring or a 6-membered ring is preferably contained), a (meth)acryloyl group, a (meth)acryloyloxy group, a halogen atom (for example, a fluorine atom, a chlorine atom, a bromine atom, and an iodine atom), an oxo group (=O), an imino group ($=NR^N$), and an alkylidene group ($=C(R^N)_2$). $R^N$ is a hydrogen atom or an alkyl group (the number of the carbon atoms is preferably 1 to 12, more preferably 1 to 6, and still more preferably 1 to 3), and is preferably a hydrogen atom, a methyl group, an ethyl group, or a propyl group. An alkyl moiety, an alkenyl moiety, and an alkynyl moiety contained in each substituent may be chain-like or cyclic, or may be linear or branched. In a case where the substituent T is a group capable of taking a substituent, the substituent T may further have a substituent T. For example, the alkyl group may become a halogenated alkyl group, or may become a (meth)acryloyloxyalkyl group, an aminoalkyl group, or a carboxyalkyl group. In a case where the substituent is a group capable of forming a salt, such as a carboxyl group or an amino group, the group may form a salt.

Examples of the linking group L include an alkylene group (the number of the carbon atoms is preferably 1 to 24, more preferably 1 to 12, and still more preferably 1 to 6), an alkenylene group (the number of the carbon atoms is preferably 2 to 12, more preferably 2 to 6, and still more preferably 2 or 3), an alkynylene group (the number of the carbon atoms is preferably 2 to 12, more preferably 2 to 6, and still more preferably 2 or 3), an (oligo)alkyleneoxy group (the number of carbon atoms in an alkylene group in one constitutional unit is preferably 1 to 12, more preferably 1 to 6, and still more preferably 1 to 3; and the number of repetitions is preferably 1 to 50, more preferably 1 to 40, and still more preferably 1 to 30), an arylene group (the number of the carbon atoms is preferably 6 to 22, more preferably 6 to 18, and still more preferably 6 to 10), an oxygen atom, a sulfur atom, a sulfonyl group, a carbonyl group, a thiocarbonyl group, —$NR^N$—, and a linking group consisting of a combination thereof. The alkylene group may have the substituent T described later. For example, the alkylene group may have a hydroxyl group. The number of atoms, excluding a hydrogen atom, contained in the linking group L is preferably 1 to 50, more preferably 1 to 40, and still more preferably 1 to 30. The number of linking atoms means the number of atoms positioned on the shortest path among the atomic groups involved in the linkage. For example, in a case of —$CH_2$—(C=O)—O—, the number of atoms involved in the linkage is 6, and is 4 even excluding a hydrogen atom. On the other hand, the shortest atom involved in the linkage is —C—C—O—, and thus the number of atoms is 3. The number of the linking atoms is preferably 1 to 24, more preferably 1 to 12, and still more preferably 1 to 6. Furthermore, the alkylene group, the alkenylene group, the alkynylene group, and the (oligo) alkyleneoxy group may be chain-like or cyclic, or may be linear or branched. In a case where the linking group is a group capable of forming a salt, such as —$NR^N$—, the group may form a salt.

The specific polymer has a polymerizable group. The substituent R may have the polymerizable group, but other moieties may have a polymerizable group. As the polymerizable group, groups generally applied to this type of material can be widely used. Examples thereof include an ethylenically unsaturated group, an epoxy group, and an oxetane group. Examples of the ethylenically unsaturated group include a vinyl group, an allyl group, a vinylphenyl group, and a (meth)acryloyl group. The polymerizable groups exemplified here are called a polymerizable group Ps. In the present invention, among them, it is preferable that a (meth)acryloyl group is applied.

It is also preferable that the specific polymer is a copolymer. The copolymer component preferably contains at least one kind of constitutional unit (hereinafter, referred to as the other constitutional unit in some cases) represented by any one of Formulae (1-1) to (1-6).

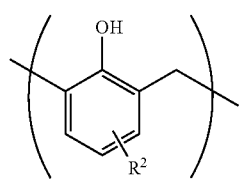

(1-1)

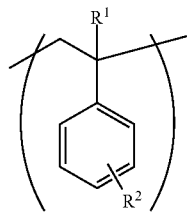

(1-2)

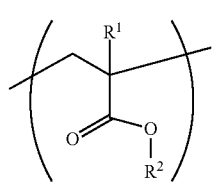

(1-3)

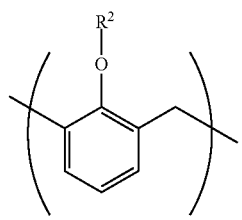

(1-4)

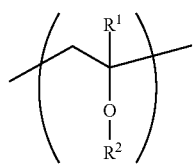

(1-5)

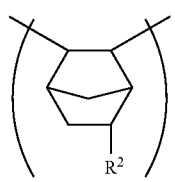

(1-6)

In Formulae (1-1) to (1-6), substituents $R^2$ are each independently a substituent having a polymerizable group, and a substituent $R^1$ is a hydrogen atom or a methyl group. The polymerizable group included in $R^2$ is preferably Ps. In a case where the number of $R^2$'s in Formulae (1-1) to (1-6) is 2 or more, that is, in a case of $(R^2)_n$ (n is a natural number of 1 or more), a plurality of $R^2$'s may be bonded to each other to form a ring. Moreover, $R^2$ may be bonded to the main chain to form a ring. In addition, the substituent T may be substituted in the main chain and the substituent $R^2$ in Formulae (1-1) to (1-6) as long as the effects of the present invention are exhibited. Furthermore, the substituent $R^2$ or the substituent T may be bonded to the main chain to form a ring.

As $R^2$, Formula (T2) is preferable. A formula weight of $R^2$ is preferably 80 to 1,000, more preferably 100 to 800, and still more preferably 150 to 600.

$$-(L)_{n6}-(P)_{n7} \quad (T2)$$

$L^4$ is the linking group L, and among them, an alkylene group, an arylene group, an (oligo)alkyleneoxy group, a carbonyl group, an oxygen atom, and a linking group related to a combination thereof are preferable. n6 is 0 or 1 and preferably 1. P has the same definition as P in Formula (T1). n7 is an integer of 1 to 6 and preferably 1 or 2. Furthermore, in a case where n7 is 2 or more, L may be a tri- or higher valent linking group, and examples thereof include a linking group containing a group having an alkane structure (the number of the carbon atoms is preferably 1 to 12, more preferably 1 to 6, and still more preferably 1 to 3), a group having an alkene structure (the number of the carbon atoms is preferably 2 to 12, more preferably 2 to 6, and still more preferably 2 or 3), or a group having an aryl structure (the number of the carbon atoms is preferably 6 to 22, more preferably 6 to 18, and still more preferably 6 to 10), which has a valence of 3 or more.

In a case where the specific polymer contains the constitutional unit represented by Formula (1), as the other constitutional unit, a constitutional unit represented by Formula (1-1) is preferable. Also regarding Formulae (2) to (6), similarly, it is preferable that constitutional units represented by Formulae (1-2) to (1-6) are respectively included.

In a case where the specific polymer is a copolymer containing the other constitutional unit, and the substituent R having a continuous partial structure containing an aromatic ring of the main constitutional unit has a polymerizable group, the number (11) of linking atoms between a carbon-carbon unsaturated bond of the polymerizable group and the main chain is preferably larger than the number (12) of linking atoms between a carbon-carbon unsaturated bond of the polymerizable group in the substituent $R^2$ and the main chain in the other constitutional unit (11−12>0). Here, the number of linking atoms is as defined above. A difference Δ1 (11−12) in the number of linking atoms is preferably more than 0 in terms of the number of linking atoms defined above. Moreover, Δ1 is preferably more than 0 and 50 or less, more preferably more than 0 and 40 or less, still more preferably more than 0 and 30 or less, and even more preferably more than 0 and 20 or less. For example, in a case of the resin G-1 which is a polymer exemplified in Example, the number (11) of linking atoms between the carbon-carbon unsaturated bond of the polymerizable group of R and the main chain is 14 and the number (12) of linking atoms between the carbon-carbon unsaturated bond of the polymerizable group of the substituent $R^2$ and the main chain is 6.

It is also preferable that the specific polymer further contains a constitutional unit (referred to as the "still other constitutional unit" in some cases) having no polymerizable group. The still other constitutional unit preferably has a skeleton of any of Formulae (1-1) to (1-6) defined for the other constitutional unit. Provided that the substituent $R^2$ becomes a substituent $R^3$ having no polymerizable group. In Formulae (1-1), (1-2), (1-4), and (1-6), two or more $R^3$'s may be substituted with a ring structure group. Moreover, the substituent T may be substituted in the still other constitutional unit as long as the effects of the present invention are exhibited. Furthermore, $R^3$ or the substituent T may be bonded to the main chain to form a ring.

$R^3$ is preferably Formula (T3). A formula weight of $R^3$ is preferably 80 to 1,000, more preferably 100 to 800, and still more preferably 150 to 600.

$$-(L^5)_{n8}-(T^1)_{n9} \quad (T3)$$

$L^5$ is the linking group L, and among them, an alkylene group, an arylene group, an (oligo)alkyleneoxy group, a carbonyl group, an oxygen atom, and a linking group related to a combination thereof are preferable. n8 is 0 or 1. $T^1$ is the substituent T, and among them, an alkyl group which may be substituted with a halogen atom, an aryl group which may be substituted with a halogen atom, and an arylalkyl group which may be substituted with a halogen atom are preferable. n9 is an integer of 1 to 6 and preferably 1 or 2. In a case where n9 is 2 or more, $L^5$ may be a tri- or higher valent linking group, and examples thereof include a linking group containing a group having an alkane structure (the number of the carbon atoms is preferably 1 to 12, more preferably 1 to 6, and still more preferably 1 to 3), a group having an alkene structure (the number of the carbon atoms is preferably 2 to 12, more preferably 2 to 6, and still more preferably 2 or 3), or a group having an aryl structure (the number of the carbon atoms is preferably 6 to 22, more preferably 6 to 18, and still more preferably 6 to 10), which has a valence of 3 or more.

In the specific polymer, the constitutional unit represented by any one of Formulae (1) to (6) may constitute the entire polymer (homopolymer in which a constitutional ratio thereof is 100% by mole), or may be a copolymer with the other constitutional unit or the still other constitutional unit.

In the specific polymer, the constitutional ratio of the constitutional units represented by Formulae (1) to (6)/the other constitutional unit (constitutional unit having a polymerizable group)/the still other constitutional unit is preferably 10 to 100/0 to 80/0 to 50, more preferably 30 to 100/0 to 70/0 to 30, and still more preferably 50 to 100/0 to 50/0 to 10, in terms of a molar ratio.

In the specific polymer, a proportion of the constitutional unit having a polymerizable group is preferably 10% to 100% by mole and more preferably 50% to 100% by mole with respect to all the constitutional units.

The specific polymer may contain only one kind of each of the constitutional units represented by Formulae (1) to (6), the other constitutional unit (constitutional unit having a polymerizable group), and the still other constitutional unit, or may contain two or more kinds thereof. In a case where two or more kinds thereof are contained, the sum preferably satisfies the above ratio.

A weight-average molecular weight of the specific polymer is preferably 4,000 or more, more preferably 5,000 or more, still more preferably 7,000 or more, and even more preferably 10,000 or more. The upper limit is preferably 2,000,000 or less, more preferably 1,500,000 or less, and still more preferably 1,000,000 or less. A method for measuring the weight-average molecular weight is based on a method described in the following Example.

The R moiety of the specific polymer can be introduced into the main chain of the polymer by a conventional method. Specifically, by reacting a glycidyl group in a polymer with a carboxylic acid group constituting R in the presence of a quaternary ammonium halide ion, introduction can be performed at a high reaction rate and a high yield. Alternatively, by reacting a hydroxyl group in a polymer with a carboxylic acid chloride group, a carboxylic acid bromide group, or a carboxylic acid group which constitutes R, introduction can be performed at a high reaction rate and a high yield.

A content ratio of the specific polymer in the composition for forming an underlayer film for imprinting is preferably 0.1% by mass or more, more preferably 0.5% by mass or more, still more preferably 1.0% by mass or more, and even more preferably 1.5% by mass or more. The upper limit is preferably 10% by mass or less, more preferably 7% by mass or less, still more preferably 5% by mass or less, even more preferably 4% by mass or less, and further still more preferably 3% by mass or less. By setting the amount to be equal to or more than the lower limit value, the effect caused by formulation of the polymer can be suitably exhibited, and a uniform thin film can be easily prepared. On the other hand, by setting the amount to be equal to or less than the upper limit value, the effect of using a solvent is suitably exhibited, and a uniform film can be easily formed over a wide area.

In addition, the content ratio of the specific polymer to a non-volatile component in the composition for forming an underlayer film for imprinting is preferably 90% by mass or more, more preferably 95% by mass or more, and still more preferably 99% by mass or more. The upper limit value is 100% by mass. By setting the amount to be equal to or more than the lower limit value, the effect caused by formulation of the polymer can be suitably exhibited, and a uniform thin film can be easily prepared. On the other hand, by setting the amount to be equal to or less than the upper limit value, the effect of using a solvent is suitably exhibited, and a uniform film can be easily formed over a wide area.

Only one kind of the specific polymer may be used, or two or more kinds thereof may be used. In a case where two or more kinds thereof are used, the total amount is preferably within the above range.

<<Alkylene Glycol Compound>>

The composition for forming an underlayer film for imprinting may contain an alkylene glycol compound. The number of alkylene glycol constitutional units contained in the alkylene glycol compound is preferably 3 to 1,000, more preferably 4 to 500, still more preferably 5 to 100, and even more preferably 5 to 50. A weight-average molecular weight (Mw) of the alkylene glycol compound is preferably 150 to 10,000, more preferably 200 to 5,000, still more preferably 300 to 3,000, and even more preferably 300 to 1,000.

Examples of the alkylene glycol compound include polyethylene glycol, polypropylene glycol, mono- or di-methyl ether thereof, mono- or di-octyl ether, mono- or di-nonyl ether, mono- or di-decyl ether, monostearate, monooleate, monoadipate, and monosuccinate, and polyethylene glycol and polypropylene glycol are preferable.

Surface tension of the alkylene glycol compound at 23° C. is preferably 38.0 mN/m or higher and more preferably 40.0 mN/m or higher. The upper limit of the surface tension is not particularly limited, but is, for example, 48.0 mN/m or lower. By formulating such a compound, the wettability of the curable composition for imprinting provided immediately above the underlayer film can be further improved.

In the present specification, the surface tension is measured at 23° C. using a surface tensiometer SURFACE TENS-IOMETER CBVP-A3 manufactured by Kyowa Interface Science Co., LTD. and a glass plate. The unit is mN/m. Regarding surface tension (γUL) of the non-volatile component (component excluding a solvent) in the composition for forming an underlayer film for imprinting, the surface tension is measured using a composition constituted of only the non-volatile component. Two samples are prepared for one level and are respectively measured three times, and an arithmetic mean value of a total of six times is adopted as an evaluation value.

In a case where the alkylene glycol compound is contained, the content thereof is 40% by mass or less, preferably 30% by mass or less, more preferably 20% by mass or less, and still more preferably 1% to 15% by mass with respect to the non-volatile component. Only one kind of the alkylene glycol compound may be used, or two or more kinds thereof may be used. In a case where two or more kinds thereof are used, the total amount is preferably within the above range.

<<Polymerization Initiator>>

The composition for forming an underlayer film for imprinting may contain a polymerization initiator. Examples of the polymerization initiator include a thermal polymerization initiator and a photopolymerization initiator, but from the viewpoint that crosslinking reactivity with the curable composition for imprinting is improved, a photopolymerization initiator is preferable. As the photopolymerization initiator, a radical polymerization initiator and a cationic polymerization initiator are preferable, and a radical polymerization initiator is more preferable. Moreover, in the present invention, a plurality of kinds of photopolymerization initiators may be used in combination.

As a photoradical polymerization initiator, a known compound can be optionally used. Examples thereof include a halogenated hydrocarbon derivative (for example, a compound having a triazine skeleton, a compound having an oxadiazole skeleton, a compound having a trihalomethyl group, and the like), an acylphosphine compound such as acylphosphine oxide, hexaarylbiimidazole, an oxime compound such as an oxime derivative, an organic peroxide, a thio compound, a ketone compound, an aromatic onium salt, ketoxime ether, an aminoacetophenone compound, hydroxyacetophenone, an azo-based compound, an azide compound, a metallocene compound, an organic boron compound, and an iron arene complex. For the details thereof, reference can be made to the description in paragraphs 0165 to 0182 of JP2016-027357A, the contents of which are incorporated in the present specification.

Examples of the acylphosphine compound include 2,4,6-trimethylbenzoyl-diphenyl-phosphine oxide. Moreover, IRGACURE-819, IRGACURE 1173, and IRGACURE-TPO (trade names: all are manufactured by BASF SE), which are commercially available products, can be used.

In a case where the photopolymerization initiator used in the composition for forming an underlayer film for imprinting is formulated, a content thereof in the non-volatile components is, for example, 0.01% to 15% by mass, preferably 0.1% to 12% by mass, and more preferably 0.2% to 7% by mass. In a case where two or more kinds of photopolymerization initiators are used, the total amount is within the above range.

<<Other Components>>

As the non-volatile component formulated in the composition for forming an underlayer film for imprinting, in addition to the above compounds, one or more kinds of a thermal polymerization initiator, a polymerization inhibitor, an antioxidant, a leveling agent, a thickener, a surfactant, or the like may be contained.

As the thermal polymerization initiator or the like, the respective components described in JP2013-036027A, JP2014-090133A, and JP2013-189537A can be used. Also regarding the content or the like, reference can be made to the description in the above publications.

In addition, in the present invention, the composition for forming an underlayer film for imprinting may not substantially contain a surfactant. The expression "not substantially contain" means that the content thereof is 0.1% by mass or less with respect to the non-volatile component in the composition for forming an underlayer film for imprinting.

<<Solvent for Underlayer Film>>

The composition for forming an underlayer film for imprinting contains a solvent. For example, the solvent preferably contains a compound (solvent for an underlayer film) which is liquid at 23° C. and has a boiling point of 250° C. or lower in a proportion of 60.0% by mass or more. In general, the non-volatile component finally forms an underlayer film. A content of the solvent for an underlayer film in the composition for forming an underlayer film for imprinting is preferably 90.0% by mass or more, and may be 97.0% by mass or more. In the present invention, the liquid refers to a compound having a viscosity at 23° C. of 100,000 mPa·s or lower.

The composition for forming an underlayer film for imprinting may contain only one kind of the solvent or two or more kinds thereof. In a case where two or more kinds thereof are contained, the total amount is preferably within the above range.

The boiling point of the solvent for an underlayer film is preferably 230° C. or lower, more preferably 200° C. or lower, still more preferably 180° C. or lower, even more preferably 160° C. or lower, and further still more preferably 130° C. or lower. The lower limit value is 23° C., but is practically 60° C. or higher. By setting the boiling point within the above range, the solvent can be easily removed from the underlayer film, which is preferable.

The solvent for an underlayer film is preferably an organic solvent. The solvent is preferably a solvent having any one or more of an ester group, a carbonyl group, a hydroxyl group, and an ether group. Among them, an aprotic polar solvent is preferably used.

As specific examples thereof, alkoxy alcohol, propylene glycol monoalkyl ether carboxylate, propylene glycol monoalkyl ether, lactate, acetate, alkoxypropionate, chain-like ketone, cyclic ketone, lactone, and alkylene carbonate are selected.

Examples of the alkoxy alcohol include methoxyethanol, ethoxyethanol, methoxypropanol (for example, 1-methoxy-2-propanol), ethoxypropanol (for example, 1-ethoxy-2-propanol), propoxypropanol (for example, 1-propoxy-2-propanol), methoxybutanol (for example, 1-methoxy-2-butanol and 1-methoxy-3-butanol), ethoxybutanol (for example, 1-ethoxy-2-butanol and 1-ethoxy-3-butanol), and methylpentanol (for example, 4-methyl-2-pentanol).

As the propylene glycol monoalkyl ether carboxylate, at least one selected from the group consisting of propylene glycol monomethyl ether acetate, propylene glycol monomethyl ether propionate, and propylene glycol monoethyl ether acetate is preferable and propylene glycol monomethyl ether acetate is particularly preferable.

In addition, as the propylene glycol monoalkyl ether, propylene glycol monomethyl ether or propylene glycol monoethyl ether is preferable.

As the lactate, ethyl lactate, butyl lactate, or propyl lactate is preferable.

As the acetate, methyl acetate, ethyl acetate, butyl acetate, isobutyl acetate, propyl acetate, isoamyl acetate, methyl formate, ethyl formate, butyl formate, propyl formate, or 3-methoxybutyl acetate is preferable.

As the alkoxypropionate, methyl 3-methoxypropionate (MMP) or ethyl 3-ethoxypropionate (EEP) is preferable.

As the chain-like ketone, 1-octanone, 2-octanone, 1-nonanone, 2-nonanone, acetone, 4-heptanone, 1-hexanone, 2-hexanone, diisobutyl ketone, phenylacetone, methyl ethyl ketone, methyl isobutyl ketone, acetylacetone, acetonylacetone, ionone, diacetonyl alcohol, acetylcarbinol, acetophenone, methyl naphthyl ketone, or methyl amyl ketone is preferable.

As the cyclic ketone, methylcyclohexanone, isophorone, or cyclohexanone is preferable.

As the lactone, γ-butyrolactone is preferable.

As the alkylene carbonate, propylene carbonate is preferable.

In addition to the above components, an ester-based solvent having 7 or more (preferably 7 to 14, more preferably 7 to 12, and still more preferably 7 to 10) carbon atoms, and having 2 or less heteroatoms is preferably used.

Preferred examples of the ester-based solvent having 7 or more carbon atoms and 2 or less heteroatoms include amyl acetate, 2-methylbutyl acetate, 1-methylbutyl acetate, hexyl acetate, pentyl propionate, hexyl propionate, butyl propionate, isobutyl isobutyrate, heptyl propionate, and butyl butanoate, and isoamyl acetate is particularly preferably used.

In addition, a solvent having a flash point (hereinafter, also referred to as fp) of 30° C. or higher is also preferably used. As such a component, propylene glycol monomethyl ether (fp: 47° C.), ethyl lactate (fp: 53° C.), ethyl 3-ethoxypropionate (fp: 49° C.), methyl amyl ketone (fp: 42° C.), cyclohexanone (fp: 30° C.), pentyl acetate (fp: 45° C.), methyl 2-hydroxyisobutyrate (fp: 45° C.), γ-butyrolactone (fp: 101° C.), or propylene carbonate (fp: 132° C.) is preferable. Among them, propylene glycol monoethyl ether, ethyl lactate, pentyl acetate, or cyclohexanone is more preferable, and propylene glycol monoethyl ether or ethyl lactate is particularly preferable.

Examples of a solvent which is particularly preferable as the solvent for an underlayer film include at least one kind selected from the group consisting of water, 1-methoxy-2-propanol, propylene glycol monomethyl ether acetate (PGMEA), ethoxyethyl propionate, cyclohexanone, 2-heptanone, γ-butyrolactone, butyl acetate, propylene glycol monomethyl ether (PGME), ethyl lactate, and 4-methyl-2-pentanol, and at least one kind selected from the group consisting of 1-methoxy-2-propanol, PGMEA, and butyl acetate is more preferable.

In a Hansen solubility parameter (HSP) vector of the partial structure B included in the specific polymer in the composition for forming an underlayer film for imprinting, (i) a dispersion element component (d component) is preferably 14.0 to 20.0, more preferably 15.0 to 19.0, and still more preferably 16.0 to 18.5, (ii) a polarity element component (p component) is preferably 3.5 to 18.0, more preferably 3.8 to 15.0, and still more preferably 4.0 to 12.0, and (iii) a hydrogen bond element component (h component) is preferably 4.0 to 15.0, more preferably 4.7 to 14.0, and still more preferably 5.2 to 12.5.

The dispersion element component, the polarity element component, and the hydrogen bond element component in the HSP vector of the partial structure B are respectively set by methods described in Examples described later. Furthermore, in a case where there are a plurality of specific polymers, it is preferable that at least one kind of the partial structure B satisfies the above range, more preferable that a component with the largest amount satisfies the above range, and still more preferable that all components satisfy the above range.

As a storage container of the composition for forming an underlayer film for imprinting, a storage container known in the related art can be used. Moreover, as the storage container, for the purpose of preventing impurities from being mixed into a raw material or a composition, a multilayer bottle having a container inner wall made of six layers of six kinds of resins or a bottle having a seven-layer structure of six kinds of resins is also preferably used. Examples of such a container include the container described in JP2015-123351A.

A film formed of the composition for forming an underlayer film for imprinting according to the embodiment of the present invention is a solid film at 23° C. Here, the "solid film at 23° C." means that the film is not a liquid having fluidity in an environment of 23° C. The "film formed" means that the film may be a liquid before being formed, that is, before being solidified. A film which is typically in a solution state where a solute is dissolved in a solvent, and becomes a solid film after being subjected to applying, heating, drying, and solidifying is exemplified. More specifically, a film which is a film formed under conditions described in a section of <Adhesiveness> in the following Example, and in which "the formed film is a solid film at 23° C." is exemplified.

<<Surface Free Energy>>

Surface free energy of an underlayer film for imprinting which is formed of the composition for forming an underlayer film for imprinting according to the embodiment of the present invention is preferably 30 mN/m or more, more preferably 40 mN/m or more, and still more preferably 50 mN/m or more. The upper limit is preferably 200 mN/m or more, more preferably 150 mN/m or more, and still more preferably 100 mN/m or more. The surface free energy is set by a method described in Example described later.

<Curable Composition for Imprinting>

<<Polymerizable Compound>>

The curable composition for imprinting contains a polymerizable compound having an aromatic ring. The polymerizable compound contained in the curable composition for imprinting may be a monofunctional polymerizable compound, a polyfunctional polymerizable compound, or a mixture of the both. Moreover, it is preferable that at least a part of the polymerizable compound contained in the curable composition for imprinting is a liquid at 23° C., more preferable that 15% by mass or more of the polymerizable compound contained in the curable composition for imprinting is a liquid at 23° C., and still more preferable that 15% to 100% by mass of the polymerizable compound is a liquid at 23° C.

In the present invention, the polymerizable compound having an aromatic ring has a "continuous partial structure containing an aromatic ring" (partial structure B). The partial structure B preferably consists of an aromatic ring and the linking group L, and preferably includes a moiety having the following Lb, $L^{21}$, and $L^{22}$.

The polymerizable compound is preferably represented by Formula (I-1).

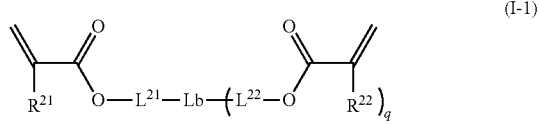

Lb is a linking group containing an aromatic ring and has the same definition as La described above, and preferred ranges thereof are also the same.

$R^{21}$ and $R^{22}$ each independently represent a hydrogen atom or a methyl group.

$L^{21}$ and $L^{22}$ each independently represent a single bond or the linking group L, and among them, an alkylene group, an alkenylene group, an (oligo)alkylene group, an oxygen atom, a carbonyl group, $NR^N$, or a group related to a combination thereof, which has a branch or the number of carbon atoms defined in the linking group L, is preferable. Lb and $L^{21}$ or $L^{22}$ may be bonded to each other via or without via the linking group L to form a ring, and examples of the formed ring include the following alicycle fCy. Lb, $L^{21}$, and $L^{22}$ may have the substituent T. A plurality of substituents T may be bonded to each other to form a ring. In a case where there are the plurality of substituents T, the plurality of substituents T may be the same as or different from each other. Preferred examples of Lb having a substituent include an aspect in which in a case where q is 0 and Lb is a substituent at a terminal, an aromatic ring (for example, a benzene ring) constituting Lb is substituted with an alkyl group (the number of the carbon atoms is preferably 1 to 12, more preferably 1 to 6, and still more preferably 1 to 3).

q is an integer of 0 to 5, preferably an integer of 0 to 3, more preferably an integer of 1 to 3, still more preferably 1 or 2, and even more preferably 1.

Lb may be constituted of only an aromatic ring, or may have a non-aromatic hydrocarbon linking group Lt. Moreover, Lb may be a linking group containing an aromatic ring, and may have a form in which the aromatic ring is not at a linking position. For example, a form in which an alkylene group is bonded between $L^2$ and $L^{22}$, and the alkylene group is substituted with an aromatic ring may be used.

In the present embodiment, the entire polymerizable compound may constitute the "continuous partial structure containing an aromatic ring" (partial structure B). Alternatively, Lb may constitute the partial structure B, or Lb, $L^{21}$, and $L^{22}$ may constitute the partial structure B.

In a case where q is 0, the aromatic ring Lb becomes a substituent at a terminal. In this case, any atom or any atomic group may be at the terminal, and examples thereof include a hydrogen atom and an alkyl group (the number of the carbon atoms is preferably 1 to 12, more preferably 1 to 6, and still more preferably 1 to 3).

Examples of the polymerizable compound include the following A-1 to A-42, but the present invention is not construed as being limited thereto.

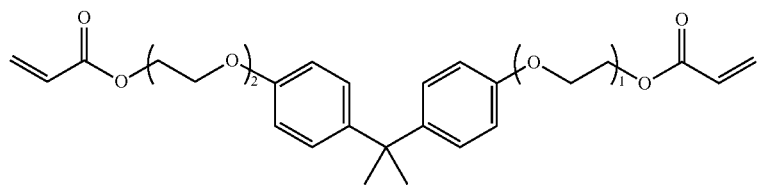

A-1

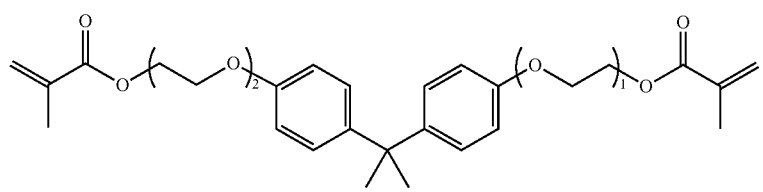

A-2

-continued
A-3
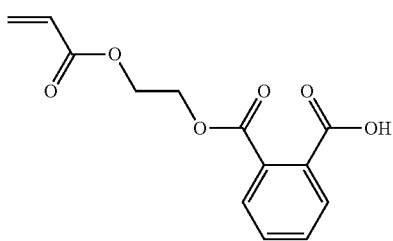
A-4
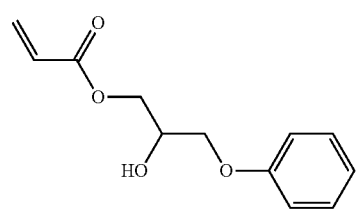
A-5
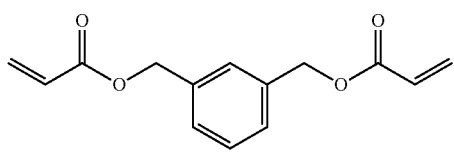
A-6
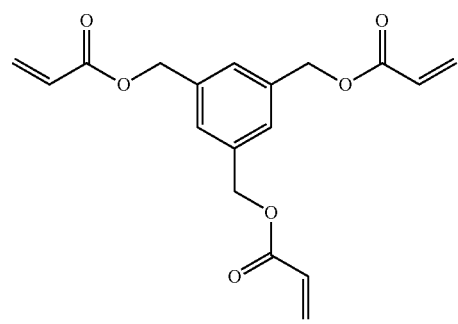
A-7
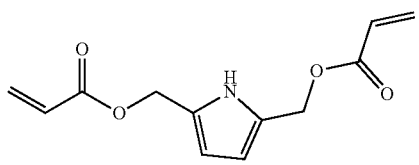
A-8
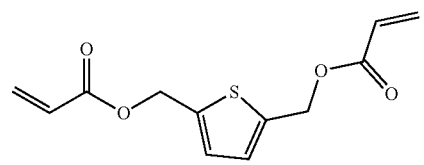
A-9
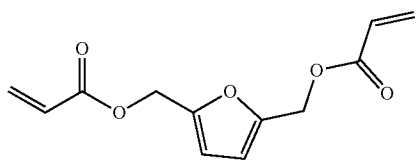
A-10
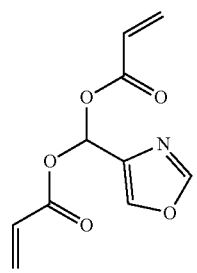
A-11
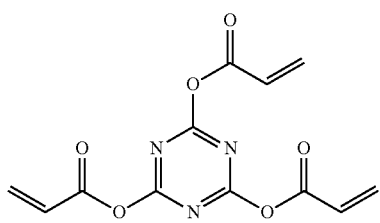
A-12
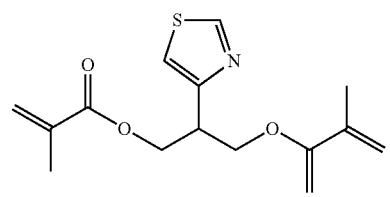
A-13-1
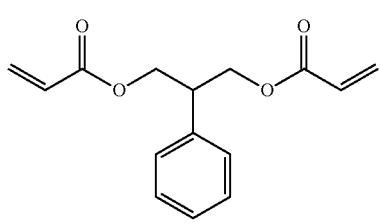
A-13-2
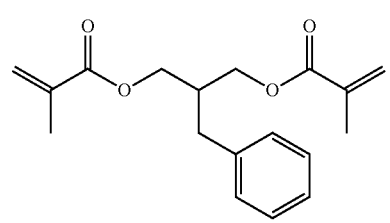

-continued
A-14
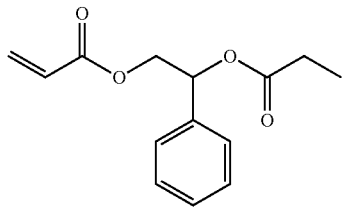
A-15
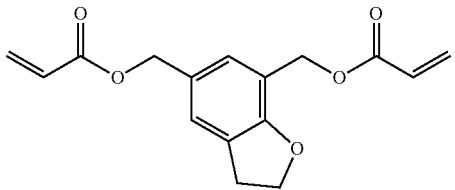
A-16
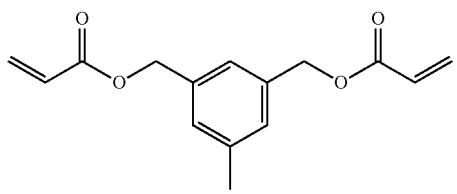
A-17
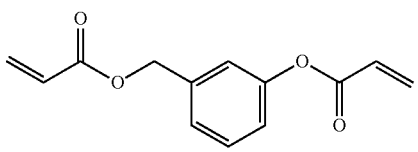
A-18
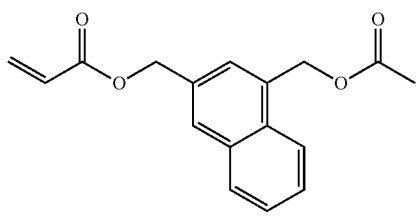
A-19
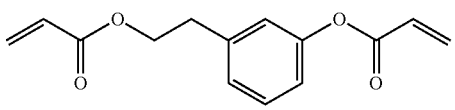
A-20
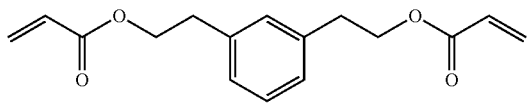
A-21
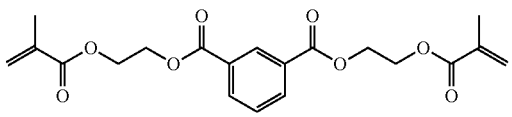
A-22
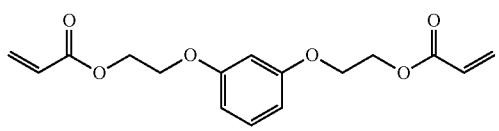
A-23
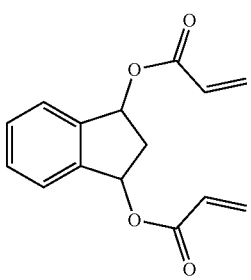
A-24
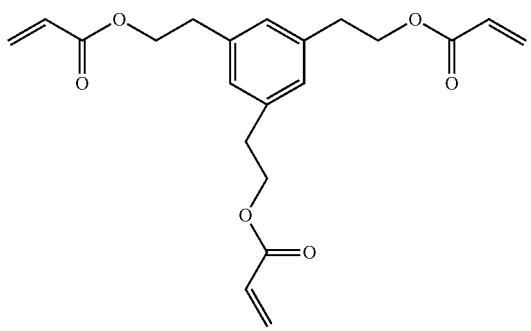
A-25
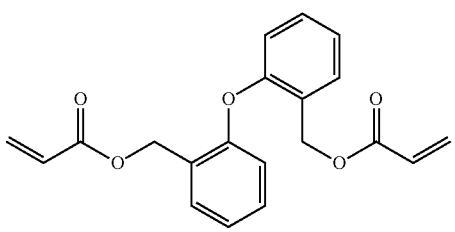
A-26
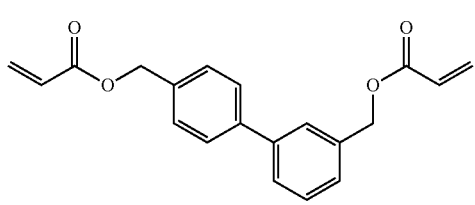
A-27
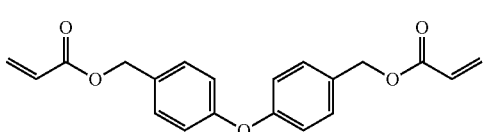

-continued
A-28
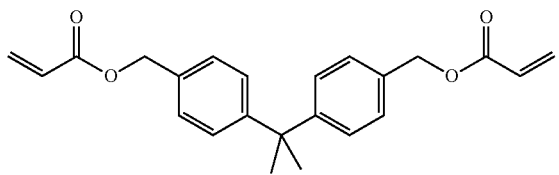
A-29
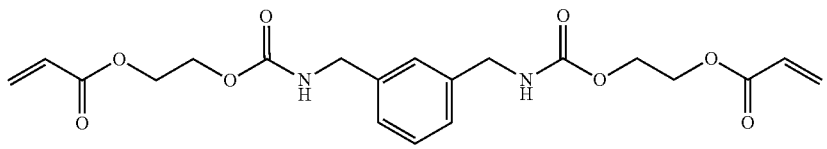
A-30
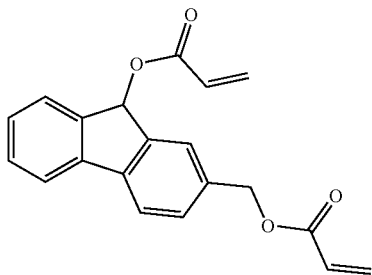
A-31
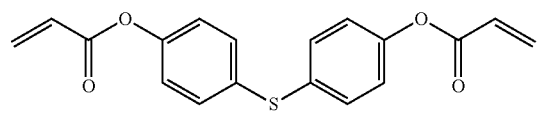
A-32
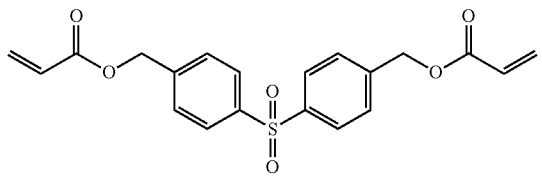
A-33
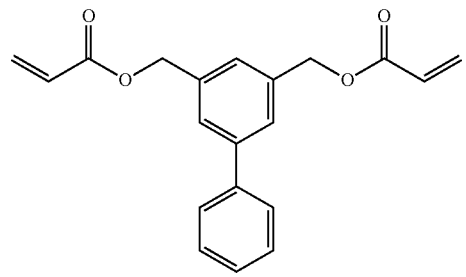
A-34
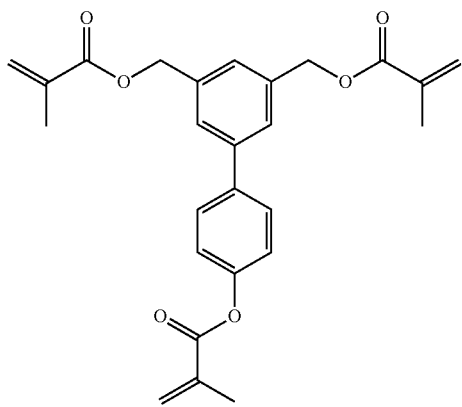
A-35
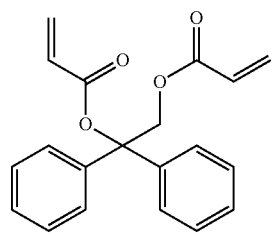

-continued

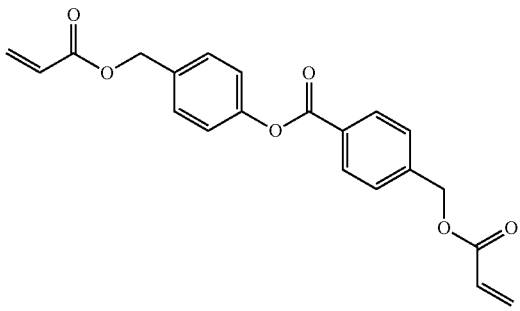
A-36

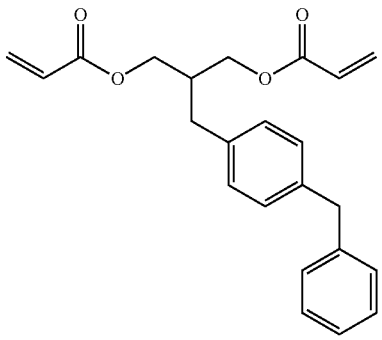
A-37

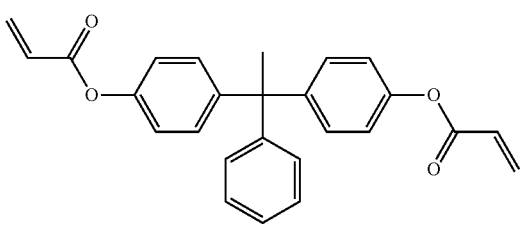
A-38

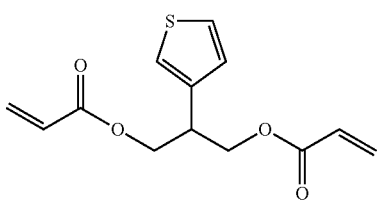
A-39

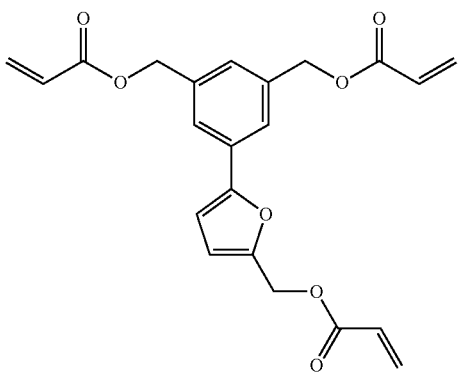
A-40

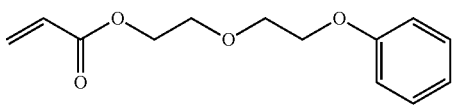
A-41

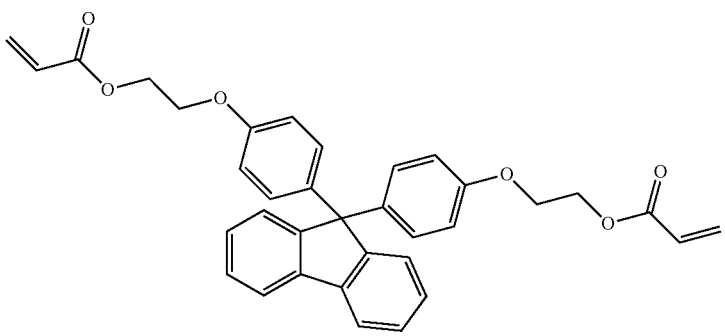
A-42

Furthermore, in the curable composition for imprinting, a polymerizable compound represented by Formula (I-2) may be used in combination.

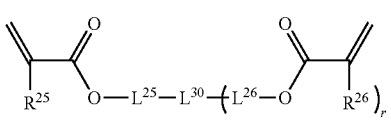
(I-2)

$L^{30}$ is a (1+r)-valent non-aromatic group (the number of the carbon atoms is preferably 1 to 40, more preferably 1 to 30, and still more preferably 1 to 20), and is preferably a group having a cyclic, linear, or branched alkane structure (the number of the carbon atoms is preferably 1 to 40, more preferably 1 to 30, and still more preferably 1 to 20), a group having a cyclic, linear, or branched alkene structure (the number of the carbon atoms is preferably 2 to 40, more preferably 2 to 30, and still more preferably 2 to 20), or a group having a cyclic, linear, or branched alkyne structure (the number of the carbon atoms is preferably 2 to 40, more preferably 2 to 30, and still more preferably 2 to 20).

$R^{25}$ and $R^{26}$ each independently represent a hydrogen atom or a methyl group.

$L^{25}$ and $L^{26}$ each independently represent a single bond or the linking group L, and among them, an alkylene group, an alkenylene group, an (oligo)alkylene group, an oxygen atom, a carbonyl group, $NR^N$, or a group related to a combination thereof, which has a branch or the number of carbon atoms defined in the linking group L, is preferable. $L^{30}$ and $L^{25}$ or $L^{26}$ may be bonded to each other via or without via the linking group L to form a ring. $L^{25}$, $L^{26}$, and $L^{30}$ may have the substituent T (excluding a group containing an aromatic ring). The plurality of substituents T (excluding a group containing an aromatic ring) may be bonded to each other to form a ring, or the substituent T may be bonded to another linking group to form a ring. In a case where there are the plurality of substituents T (excluding a group containing an aromatic ring), the plurality of substituents T may be the same as or different from each other.

r is an integer of 0 to 4, preferably an integer of 0 to 3, more preferably an integer of 0 to 2, still more preferably 0 or 1, and even more preferably 1. Moreover, $L^{30}$ may have the linking group Lh having a heteroatom, which is interposed in the chain. In a case where the linking group Lh is interposed, the number thereof is preferably one for every 1 to 6 carbon atoms of $L^{30}$. As an aspect in which an oxygen atom is interposed as Lh, an ether structure of alkyleneoxyalkylene is exemplified. The structure may be a ring structure, and for example, may be an oxolane ring in which a carbon atom of a cyclopentane ring is substituted with an oxygen atom.

In a case where $L^{30}$ is a group having a ring structure, the number of carbon atoms is preferably 3 to 22, more preferably 4 to 18, and still more preferably 6 to 10. Specific examples thereof include a cyclopropane ring, a cyclobutane ring, a cyclobutene ring, a cyclopentane ring, a cyclohexane ring, a cyclohexene ring, a cycloheptane ring, a cyclooctane ring, a dicyclopentadiene ring, a tetrahydrodicyclopentadiene ring, an octahydronaphthalene ring, a decahydronaphthalene ring, a hexahydroindane ring, a bornane ring, a norbornane ring, a norbornene ring, an isobornane ring, a bicyclononane ring, a tricyclodecane ring, a tetracyclododecane ring, an adamantane ring, an oxane ring, a dioxane ring, a dioxolane ring, an oxirane ring, an oxolane ring, a morpholine ring, a piperazine ring, a piperidine ring, a pyrrolidine ring, and a pyrrolidone ring (the above examples are referred to as the ring fCy).

Examples of the polymerizable compound which may be used in combination include compounds exemplified in the following Examples, but the present invention is not construed as being limited thereto.

The lower limit of the molecular weight of the polymerizable compound is preferably 100 or more and may be 150 or more. Moreover, the upper limit of the molecular weight of the polymerizable compound is preferably 1,000 or less, more preferably 750 or less, still more preferably 600 or less, even more preferably 500 or less, and further still more preferably 450 or less, and may be 400 or less.

The content of the polymerizable compound in the curable composition for imprinting is preferably 30% by mass or more, more preferably 45% by mass or more, still more preferably 50% by mass or more, even more preferably 55% by mass or more, further still more preferably 60% by mass or more, and further even more preferably 70% by mass or more, and may be 80% by mass or more, further 85% by mass or more, or particularly 90% by mass or more. Moreover, the upper limit value is preferably less than 99% by mass and more preferably 98% by mass or less, and can also be 97% by mass or less.

A proportion of the polymerizable compound having an aromatic ring in the polymerizable compound is preferably 50% by mass or more and more preferably 60% by mass or more. Moreover, the upper limit value may be 100% by mass.

<<Other Components>>

The curable composition for imprinting may contain additives other than the polymerizable compound. A polymerization initiator, a surfactant, a sensitizer, a release agent, an antioxidant, a polymerization inhibitor, or the like may be contained as other additives.

Specific examples of the curable composition for imprinting that can be used in the present invention include the compositions described in JP2013-036027A, JP2014-090133A, and JP2013-189537, the contents of which are incorporated in the present specification. Moreover, also regarding preparation of the curable composition for imprinting and a method for forming a film (pattern forming layer), reference can be made to the description in the above publications, the contents of which are incorporated in the present specification.

<<Physical Property Value or the Like>>

A viscosity of the curable composition for imprinting is preferably 20.0 mPa·s or lower, more preferably 15.0 mPa·s or lower, still more preferably 11.0 mPa·s or lower, and even more preferably 9.0 mPa·s or lower. The lower limit value of the viscosity is not particularly limited, but can be, for example, 5.0 mPa·s or higher.

Surface tension (γResist) of the curable composition for imprinting is preferably 30.0 mN/m or higher and more preferably 31.0 mN/m or higher. By using the curable composition for imprinting which has high surface tension, a capillary force is increased and high-speed filling of a mold pattern with the curable composition for imprinting is possible. The upper limit value of the surface tension is not particularly limited, but from the viewpoint that a relationship with the underlayer film and ink jet suitability are imparted, is preferably 40.0 mN/m or lower and more preferably 38.0 mN/m or lower, and may be 36.0 mN/m or lower.

An Ohnishi parameter of the curable composition for imprinting is preferably 5.0 or less, more preferably 4.0 or less, and still more preferably 3.7 or less. The lower limit value of the Ohnishi parameter of the curable composition for imprinting is not particularly limited, but may be, for example, 1.0 or more or further 2.0 or more.

For each of the polymerizable compounds of the curable composition for imprinting, the Ohnishi parameter can be determined by substituting the number of carbon atoms, the number of hydrogen atoms, and the number of oxygen atoms in all constituent components into the following expression.

Ohnishi parameter=sum of number of carbon atoms, number of hydrogen atoms, and number of oxygen atoms/(number of carbon atoms−number of oxygen atoms)

In a Hansen solubility parameter (HSP) vector of the polymerizable compound contained in the curable composition for imprinting, (i) a dispersion element component (d component) is preferably 14.0 to 20.0, more preferably 15.0 to 19.0, and still more preferably 16.0 to 18.5, (ii) a polarity element component (p component) is preferably 3.5 to 18.0, more preferably 3.8 to 15.0, and still more preferably 4.0 to 12.0, and (iii) a hydrogen bond element component (h component) is preferably 4.0 to 15.0, more preferably 4.7 to 14.0, and still more preferably 5.2 to 12.5.

The dispersion element component, the polarity element component, and the hydrogen bond element component in the HSP vector of the polymerizable compound are respectively set by methods described in Examples described later. Furthermore, in a case where there are the plurality of polymerizable compounds contained in the curable composition for imprinting, it is preferable that at least one kind thereof satisfies the above range and more preferable that a component with the largest amount satisfies the above range.

In the present invention, a content of the solvent in the curable composition for imprinting is preferably 5% by mass or less, more preferably 3% by mass or less, and still more preferably 1% by mass or less with respect to the curable composition for imprinting.

The curable composition for imprinting can adopt an aspect in which a polymer (a polymer having preferably a weight-average molecular weight of more than 1,000, more preferably a weight-average molecular weight of more than 2,000, and still more preferably a weight-average molecular weight of 10,000 or more) is not substantially contained. The expression "polymer is not substantially contained" means, for example, that the content of the polymer is 0.01% by mass or less with respect to the curable composition for imprinting, and it is preferable that the content is 0.005% by mass or less and more preferable that the polymer is not contained at all.

As a storage container of the curable composition for imprinting used in the present invention, a storage container known in the related art can be used. Moreover, as the storage container, for the purpose of preventing impurities from being mixed into a raw material or a composition, a multilayer bottle having a container inner wall made of six layers of six kinds of resins or a bottle having a seven-layer structure of six kinds of resins is also preferably used. Examples of such a container include the container described in JP2015-123351A.

<Hansen Solubility Parameter>

In the present invention, the following ΔHSP, which is derived from a Hansen solubility parameter of at least one kind of polymerizable compound contained in the curable composition for imprinting and a Hansen solubility parameter of the continuous partial structure (partial structure B) containing an aromatic ring which is included in R of the specific polymer contained in the composition for forming an underlayer film for imprinting, is preferably 7 or less, more preferably 6 or less, and still more preferably 5 or less. ΔHSP is even more preferably 4 or less and further still more preferably 3 or less.

$$\Delta\text{HSP}=[4.0\times(\Delta d^2+\Delta p^2+\Delta h^2)]^{0.5};$$

$\Delta d$ is a difference between a dispersion element component of a Hansen solubility parameter vector of the polymerizable compound and a dispersion element component of a Hansen solubility parameter vector of the partial structure B, $\Delta p$ is a difference between a polarity element component of the Hansen solubility parameter vector of the polymerizable compound and a polarity element component of the Hansen solubility parameter vector of the partial structure B, and $\Delta h$ is a difference between a hydrogen bond element component of the Hansen solubility parameter vector of the polymerizable compound and a hydrogen bond element component of the Hansen solubility parameter vector of the partial structure B.

The dispersion element component, the polarity element component, and the hydrogen bond element component in the HSP vector of the polymerizable compound or the partial structure B of the specific polymer are respectively set by methods described in Examples described later.

Regarding the Hansen solubility parameter of at least one kind of polymerizable compound contained in the curable composition for imprinting, it is more preferable that a Hansen solubility parameter of a component with the highest content among the polymerizable compounds contained in the curable composition for imprinting satisfies at least the above conditions. Moreover, in the present invention, it is preferable that a component with the highest content among the polymerizable compounds contained in the curable composition for imprinting accounts for 55% by mass or more of the entire polymerizable compound.

Furthermore, in the present invention, it is also preferable that a mixture of the polymerizable compounds contained in the curable composition for imprinting satisfies the above conditions.

<Laminate and Production Method Therefor>

As a preferred embodiment of the kit according to the embodiment of the present invention, a laminate formed from the kit is exemplified. The laminate according to the present embodiment preferably includes an underlayer film formed of the composition for forming an underlayer film for imprinting, and an imprint layer which is formed of the curable composition for imprinting and is positioned on a surface of the underlayer film. The production method therefor is not particularly limited, but a production method using the kit, and including applying a curable composition for imprinting onto a surface of an underlayer film formed of the composition for forming an underlayer film for imprinting is exemplified. At this time, the curable composition for imprinting is preferably applied onto the surface of the underlayer film by an ink jet method (IJ method). It is preferable that the method for producing a laminate further includes a step of applying the composition for forming an underlayer film for imprinting in a layer form onto a substrate, and heating the composition for forming an underlayer film for imprinting applied in a layer form at 80° C. to 250° C. (preferably 150° C. to 250° C.).

<Cured Product Pattern and Production Method Therefor>

A method for producing a cured product pattern according to the preferred embodiment of the present invention is a method for producing a cured product pattern using the kit, and includes: an underlayer film formation step of applying a composition for forming an underlayer film for imprinting onto a substrate to form an underlayer film; an application step of applying a curable composition for imprinting onto a surface of the underlayer film; a mold contact step of bringing the curable composition for imprinting into contact with a mold having a pattern for transferring a pattern shape; a light irradiation step of irradiating the curable composition for imprinting with light to form a cured product; and a release step of separating the mold from the cured product.

Hereinafter, a method for forming a cured product pattern (method for producing a cured product pattern) will be described with reference to FIGS. 1A to 1G. It goes without saying that the configuration of the present invention is not limited by the drawings.

<<Underlayer Film Formation Step>>

In the underlayer film formation step, as shown in FIG. 1B, an underlayer film 2 is formed on a substrate 1. The underlayer film is preferably formed by applying the composition for forming an underlayer film for imprinting in a layer form onto the substrate.

A method for applying the composition for forming an underlayer film for imprinting onto the substrate is not particularly limited, and a generally well-known application method can be adopted. Specific examples of the application method include a dip coating method, an air knife coating method, a curtain coating method, a wire bar coating method, a gravure coating method, an extrusion coating method, a spin coating method, a slit scanning method, and an ink jet method, and a spin coating method is preferable.

Furthermore, after the composition for forming an underlayer film for imprinting is applied in a layer form onto the substrate, preferably, the solvent is volatilized (dried) by heat to form an underlayer film which is a thin film. The composition for forming an underlayer film for imprinting applied in a layer form is preferably heated (baked) at 80° C. to 250° C. (preferably 150° C. or higher and 250° C. or lower). A heating time can be 30 seconds to 5 minutes.

A thickness of the underlayer film 2 is preferably 2 nm or more, more preferably 3 nm or more, and still more preferably 4 nm or more, and may be 5 nm or more or 7 nm or more. Moreover, the thickness of the underlayer film is preferably 40 nm or less, more preferably 30 nm or less, and still more preferably 20 nm or less, and may be 15 nm or less or further 10 nm or less. By setting the film thickness to be equal to or more than the lower limit value, extendability (wettability) of the curable composition for imprinting on the underlayer film is improved, and a uniform residual film can be formed after imprint. By setting the film thickness to be equal to or less than the upper limit value, the residual film after imprint becomes thin, unevenness in the film thickness is less likely to occur, and uniformity of the residual film tends to be improved.

A material of the substrate is not particularly limited, reference can be made to the description in paragraph 0103 of JP2010-109092A (the publication number of the corresponding US application is US2011/0183127), the contents of which are incorporated in the present specification. In the present invention, examples thereof include a silicon substrate, a glass substrate, a quartz substrate, a sapphire substrate, a silicon carbide (silicon carbide) substrate, a gallium nitride substrate, an aluminum substrate, an amorphous aluminum oxide substrate, a polycrystalline aluminum oxide substrate, and a substrate made of GaAsP, GaP, AlGaAs, InGaN, GaN, AlGaN, ZnSe, AlGa, InP, or ZnO. Furthermore, specific examples of a material of the glass substrate include aluminosilicate glass, aluminoborosilicate glass, and barium borosilicate glass. In the present invention, a silicon substrate is preferable.

<<Application Step>>

In the application step, for example, as shown in FIG. 1C, a curable composition 3 for imprinting is applied to the surface of the underlayer film 2.

A method for applying the curable composition for imprinting is not particularly limited, reference can be made to the description in paragraph 0102 of JP2010-109092A (the publication number of the corresponding US application is US2011/0183127), the contents of which are incorporated in the present specification. The curable composition for imprinting is preferably applied onto the surface of the underlayer film by an ink jet method. Moreover, the curable composition for imprinting may be applied through multiple applying. In a method for arranging liquid droplets on the surface of the underlayer film by the ink jet method or the like, an amount of the liquid droplet is preferably about 1 to 20 pL, and the liquid droplets are preferably arranged on the surface of the underlayer film at an interval between liquid droplets. The interval between liquid droplets is preferably an interval of 10 to 1,000 μm. In a case of the ink jet method, the interval between liquid droplets is an arrangement interval between ink jet nozzles.

Furthermore, a volume ratio of the underlayer film 2 to the film-like curable composition 3 for imprinting applied onto the underlayer film is preferably 1:1 to 500, more preferably 1:10 to 300, and still more preferably 1:50 to 200.

In addition, the method for producing a laminate according to the preferred embodiment of the present invention is a production method using the kit according to the embodiment of the present invention, and includes applying the curable composition for imprinting onto the surface of the underlayer film formed of the composition for forming an underlayer film for imprinting. It is preferable that the method for producing a laminate according to the preferred embodiment of the present invention further includes a step of applying the composition for forming an underlayer film for imprinting in a layer form onto a substrate, and heating (baking) the composition for forming an underlayer film for imprinting applied in a layer form. A heating time can be 30 seconds to 5 minutes.

<<Mold Contact Step>>

In the mold contact step, for example, as shown in FIG. 1D, the curable composition 3 for imprinting is brought into contact with a mold 4 having a pattern for transferring a pattern shape. Through such a step, a desired cured product pattern (imprint pattern) is obtained. That is, a laminate which includes an imprint layer positioned on the surface of the underlayer film formed of the composition for forming an underlayer film for imprinting can be produced.

Specifically, in order to transfer a desired pattern to the film-like curable composition for imprinting, the mold 4 is pressed against the surface of the film-like curable composition 3 for imprinting.

The mold may be a light-transmitting mold or a non-light-transmitting mold. In a case where the light-transmitting mold is used, it is preferable that the curable composition 3 for imprinting is irradiated with light from a mold side. On the other hand, in a case where the non-light-transmitting mold is used, it is preferable that a light-transmitting substrate is used as a substrate and light is radiated from a substrate side. In the present invention, it is more preferable that the light-transmitting mold is used and light is radiated from the mold side.

A mold which can be used in the present invention is a mold having a pattern to be transferred. The pattern of the mold can be formed according to a desired processing accuracy, for example, by photolithography, electron beam lithography, or the like, but in the present invention, a method for producing a mold pattern is not particularly limited. Moreover, a pattern formed by the method for producing a cured product pattern according to the preferred embodiment of the present invention can be used as a mold.

A material constituting the light-transmitting mold used in the present invention is not particularly limited, but examples thereof include glass, quartz, a light-transmitting resin such as polymethyl methacrylate (PMMA) and a polycarbonate resin, a transparent metal vapor-deposited film, a flexible film such as polydimethylsiloxane, a photo-cured film, and a metal film, and quartz is preferable.

A non-light-transmission-type mold material used in a case where a light-transmitting substrate is used in the present invention is not particularly limited, but may be any material having a predetermined strength. Specific examples thereof include a ceramic material, a vapor-deposited film, a magnetic film, a reflective film, a substrate of a metal such as Ni, Cu, Cr, and Fe, and a substrate of SiC, silicon, silicon nitride, polysilicon, silicon oxide, or amorphous silicon, but there is no particular restriction.

In the method for producing a cured product pattern, in a case where imprint lithography is performed using the curable composition for imprinting, mold pressure is preferably set to 10 atm or less. By setting the mold pressure to 10 atm or less, the mold or the substrate is less likely to be deformed and the pattern accuracy tends to be improved. Moreover, also from the viewpoint that a device tends to be reduced in size due to low pressure, the above range is preferable. The mold pressure is preferably selected from a range in which the residual film of the curable composition for imprinting corresponding to a projection part of the mold is reduced while uniformity of mold transfer can be ensured.

In addition, it is also preferable that the contact between the curable composition for imprinting and the mold is performed under an atmosphere containing a helium gas, a condensable gas, or both a helium gas and a condensable gas.

<<Light Irradiation Step>>

In the light irradiation step, the curable composition for imprinting is irradiated with light to form a cured product. An irradiation dose of light irradiation in the light irradiation step may be sufficiently larger than the minimum irradiation dose required for curing. The irradiation dose required for curing is appropriately determined by examining consumption of an unsaturated bond of the curable composition for imprinting or the like.

A kind of light to be radiated is not particularly limited, but ultraviolet light is exemplified.

In addition, in the imprint lithography applied to the present invention, a temperature of the substrate during light irradiation is usually room temperature, but in order to increase reactivity, light irradiation may be performed while heating. Since setting a vacuum state as a stage prior to the light irradiation is effective in preventing bubbles from being mixed, suppressing a decrease in reactivity due to oxygen mixing, and improving adhesiveness between the mold and the curable composition for imprinting, the light irradiation may be performed in a vacuum state. Moreover, in the method for producing a cured product pattern, a preferred degree of vacuum during the light irradiation is in a range of $10^{-1}$ Pa to normal pressure.

At the time of exposure, exposure illuminance is preferably in a range of 1 to 500 $mW/cm^2$ and more preferably in a range of 10 to 400 $mW/cm^2$. An exposure time is not particularly limited, but is preferably 0.01 to 10 seconds and more preferably 0.5 to 1 second. An exposure dose is preferably in a range of 5 to 1000 $mJ/cm^2$ and more preferably in a range of 10 to 500 $mJ/cm^2$.

In the method for producing a cured product pattern, after the film-like curable composition for imprinting (pattern forming layer) is cured by the light irradiation, as necessary, a step of applying heat to the cured pattern to further cure the pattern may be included. A temperature for heating and curing the curable composition for imprinting after the light irradiation is preferably 150° C. to 280° C. and more preferably 200° C. to 250° C. Moreover, a time for applying heat is preferably 5 to 60 minutes and more preferably 15 to 45 minutes.

<<Release Step>>

In the release step, the cured product and the mold are separated from each other (FIG. 1E). The obtained cured product pattern can be used for various uses as described later.

That is, the present invention discloses a laminate further having the cured product pattern formed from the curable composition for imprinting on the surface of the underlayer film. Moreover, a thickness of the pattern forming layer consisting of the curable composition for imprinting used in the present invention varies depending on intended uses, but is about 0.01 μm to 30 μm.

Furthermore, as described later, etching or the like can also be performed.

<Cured Product Pattern and Application Thereof>

As described above, the cured product pattern formed by the method for producing a cured product pattern can be used as a permanent film used for a liquid crystal display device (LCD) or the like, or an etching resist (mask for lithography) for manufacturing a semiconductor element.

In particular, the present invention discloses a method for manufacturing a circuit board, which includes a step of obtaining a cured product pattern by the method for producing a cured product pattern according to the preferred embodiment of the present invention. The method for manufacturing a circuit board according to the preferred embodiment of the present invention may further include a step of performing etching or ion implantation on the substrate using the cured product pattern obtained by the method for producing a cured product pattern a mask and a step of forming an electronic member. The circuit board is preferably a semiconductor element. Moreover, the present invention discloses a method for manufacturing electronic equipment, which includes a step of obtaining a circuit board by the method for manufacturing a circuit board and a step of connecting the circuit board and a control mechanism for controlling the circuit board.

In addition, a grid pattern is formed on a glass substrate of the liquid crystal display device using the pattern formed by the method for producing a cured product pattern, and thus a polarizing plate having low reflection or absorption and a large screen size (for example, 55 inches or more than 60 inches) can be manufactured at low cost. For example, the polarizing plate described in JP2015-132825A or WO2011/132649A can be manufactured. Moreover, 1 inch is 25.4 mm.

The cured product pattern formed in the present invention is also useful as an etching resist (mask for lithography) as shown in FIGS. 1F and 1G. In a case where the cured product pattern is used as an etching resist, first, a silicon substrate (silicon wafer or the like) in which a thin film such as $SiO_2$ is formed or the like is used as a substrate, and a fine cured product pattern of a nano or micron order is formed on the substrate by the method for producing a cured product pattern. The present invention is particularly advantageous in that a fine pattern of a nano order can be formed, and a pattern having a size of 50 nm or less and particularly 30 nm or less can also be formed. The lower limit value of the size of the cured product pattern formed by the method for producing a cured product pattern is not particularly limited, but can be, for example, 1 nm or more.

Furthermore, the present invention also discloses a method for producing a mold for imprinting, which includes a step of obtaining a cured product pattern on the substrate by the method for producing a cured product pattern according to the preferred embodiment of the present invention and a step of etching the substrate using the obtained cured product pattern.

By performing etching with an etching gas such as hydrogen fluoride or the like in a case of wet etching and $CF_4$ or the like in a case of dry etching, a desired cured product pattern can be formed on the substrate. The cured product pattern has favorable etching resistance particularly to dry etching. That is, the pattern formed by the method for producing a cured product pattern is preferably used as a mask for lithography.

FIG. 2 is a plan view schematically showing a state of wet spreading of a curable composition for imprinting in a case where the curable composition for imprinting is applied onto a surface of an underlayer film by an ink jet method. In a case where the curable composition for imprinting is applied by the ink jet (IJ) method, for example, as shown in the same drawing, liquid droplets of a curable composition 22 for imprinting are added dropwise onto a surface of an underlayer film 21 at equal intervals ((a) of FIG. 2). In a case where a mold is brought into contact with the liquid droplets, the liquid droplets are spread on the underlayer film 21 and become film-like curable compositions 22a, 22b, and 22c for imprinting ((b), (c), and (d) of FIG. 2). However, in a case where the curable composition for imprinting is not uniformly spread and, for example, wet spreading is stopped in (c) of FIG. 2, a film which is not completely spread in a state of the curable composition 22b for imprinting is formed on the underlayer film 21. That is, a region 23 having a small film thickness or no film may be generated. In this case, a portion of a pattern of the mold, which is not sufficiently filled with the curable composition for imprinting, is generated, and a portion without a pattern is formed in an imprint layer. For example, in a case where etching is performed using a pattern of the imprint layer having a defect or a portion with an insufficient thickness in such a part as a mask, etching unevenness in the region 23 having a small film thickness or no film and the other region 22b occurs, and it becomes difficult to uniformly etch and transfer a desired pattern shape over the entire imprint region.

On the other hand, according to the composition for forming an underlayer film for imprinting according to the embodiment of the present invention, the interfacial tension between the underlayer film formed of the composition and the curable composition for imprinting is improved, and the wettability is improved. Therefore, the curable composition 22c for imprinting which is more surely spread to every corner in a state of (d) of FIG. 2 is obtained. As a result, the entire mold is accurately and sufficiently filled with the curable composition for imprinting, and favorable patterning without unevenness in the thickness can be achieved in the formed imprint layer. Moreover, improvement in filling properties enables high-speed imprint, which can lead to improvement in throughput.

Furthermore, in the above description, the action mechanism according to the preferred embodiment of the present invention has been described with the example in which the curable composition for imprinting is applied onto the underlayer film by the ink jet method, but the present invention is not construed as being limited thereto. For example, also in screen coating or spin coating, favorable wettability and excellent filling properties lead to advantages in processing and product quality, and the effects of the present invention can be suitably exhibited.

Specifically, the pattern formed in the present invention can be preferably used for producing a recording medium such as a magnetic disc, a light-receiving element such as a solid-state imaging element, a light emitting element such as a light emitting diode (LED) and organic electroluminescence (organic EL), an optical device such as a liquid crystal display device (LCD), an optical component such as a diffraction grating, a relief hologram, an optical waveguide, an optical filter, and a microlens array, a member for flat panel display such as a thin film transistor, an organic transistor, a color filter, an antireflection film, a polarizing plate, a polarizing element, an optical film, and a column material, a nanobiodevice, an immunoassay chip, a deoxyribonucleic acid (DNA) separation chip, a microreactor, a photonic liquid crystal, or a guide pattern for fine pattern formation (directed self-assembly, DSA) using self-assembly of block copolymers.

EXAMPLES

Hereinafter, the present invention will be described more specifically with reference to Examples. The materials, the used amounts, the ratios, the treatment details, the treatment procedures, and the like shown in the following Examples can be appropriately modified without departing from the spirit of the present invention. Therefore, the scope of the present invention is not limited to the specific examples described below.

<Synthesis Example of Resin G-1>

PGME (45.38 g) was added to a three-neck flask with $N_2$ flow, and heated to 90° C. 2-Hydroxyethyl methacrylate (manufactured by Tokyo Chemical Industry Co., Ltd., 13.01 g, 100.0 mmol), glycidyl methacrylate (manufactured by NOF CORPORATION, 14.22 g, 100.0 mmol), and a photoradical polymerization initiator (manufactured by Wako Pure Chemical Corporation, V-601, 0.92 g, 4.0 mmol) were dissolved in PGME (45.38 g), the obtained mixture was added dropwise over 2 hours at an internal temperature of the flask which was not higher than 95° C., and the resultant was further aged at 90° C. for 4 hours. Thereafter, the resultant was cooled to 25° C. Diisopropyl ether (435.5 g) and hexane (186.6 g) were added to another three-neck flask, cooled to 0° C., and stirred. The reaction solution in the flask was added dropwise thereto at a temperature which was not higher than 5° C. over 30 minutes, followed by stirring for 1 hour. Subsequently, the mixture was allowed to stand still for 1 hour and filtered under reduced pressure. The obtained powder was dried under reduced pressure to synthesize a target compound (intermediate G-1A).

PGME (45.38 g) and the intermediate G-1A (13.61 g, 100.0 mmol), triethylamine (manufactured by Tokyo Chemical Industry Co., Ltd., 7.59 g, 75.0 mmol) were added to a three-neck flask with $N_2$ flow, and cooled to 0° C. PGME (45.38 g) was mixed with acryloyl chloride (5.43 g, 60.0 mmol), the mixture was added dropwise over 2 hours at an internal temperature of the flask which was not higher than 10° C., and the resultant was further aged at 20° C. for 4 hours. Thereafter, the resultant was cooled to 0° C. Diisopropyl ether (435.5 g) and hexane (186.6 g) were added to another three-neck flask, cooled to 0° C., and stirred. The reaction solution in the flask was added dropwise thereto at a temperature which was not higher than 5 C over 30 minutes, followed by stirring for 1 hour. Subsequently, the mixture was allowed to stand still for 1 hour and filtered under reduced pressure. The obtained powder was washed with water and dried under reduced pressure to synthesize a target compound (intermediate G-1B).

PGMEA (45.38 g), phthalic acid (manufactured by Tokyo Chemical Industry Co., Ltd., 16.61 g, 100.0 mmol), glycidyl acrylate (manufactured by NOF CORPORATION, 2.56 g, 20.0 mmol), tetraethylammonium bromide (manufactured by Tokyo Chemical Industry Co., Ltd., 0.21 g, 1.0 mmol), and 4-OH-TEMPO (manufactured by Tokyo Chemical Industry Co., Ltd., 1.72 mg, 0.01 mmol) were added to a three-neck flask with $N_2$ flow, and aged at 90° C. for 8 hours. Thereafter, ethyl acetate (800 mL) and distilled water (500 mL) were added and liquid separation was performed. An aqueous layer was removed, a 1% $NaHCO_3$ aqueous solution (500 mL) was added, and liquid separation was performed. An aqueous layer was removed, 500 mL of distilled water was added, and liquid separation was performed. An organic layer was concentrated and purified by silica gel chromatography to synthesize a target compound (intermediate G-1C).

PGMEA (45.38 g), the intermediate G-1B, the intermediate G-1C, and tetraethylammonium bromide (manufactured by Tokyo Chemical Industry Co., Ltd., 0.21 g, 1.0 mmol), and 4-OH-TEMPO (manufactured by Tokyo Chemical Industry Co., Ltd., 1.72 mg, 0.01 mmol) were added to a three-neck flask with $N_2$ flow, and aged at 90° C. for 8 hours. Thereafter, the mixture was cooled to 25° C. Diisopropyl ether (435.5 g) and hexane (186.6 g) were added to another three-neck flask, cooled to 0° C., and stirred. The reaction solution in the flask was added dropwise thereto at a temperature which was not higher than 5° C. over 30 minutes, followed by stirring for 1 hour. Subsequently, the mixture was allowed to stand still for 1 hour and filtered under reduced pressure. The obtained powder was dried under reduced pressure to synthesize a target compound (G-1).

Other resins were synthesized according to the above synthesis example.

<Preparation of Composition for Forming Underlayer Film>

Respective components were formulated as shown in Tables 1 to 3, and the resultant was subjected to two-stage filtration with a polytetrafluoroethylene (PTFE) filter having a pore size of 0.1 μm and a UPE filter having a pore size of 0.003 μm to prepare compositions for forming an underlayer film for imprinting shown in Examples and Comparative Examples. As the resin, polymers described below the tables were used. Tables 1 to 3 also show numbers of curable compositions for imprinting used in combination.

<Preparation of Curable Composition for Imprinting>

Preparation was performed by mixing respective compounds shown in Table 4, and further adding 4-hydroxy-2,2,6,6-tetramethylpiperidine-1-oxyl free radical (manufactured by Tokyo Chemical Industry Co., Ltd.) as a polymerization inhibitor in an amount of 200 ppm by mass (0.02% by mass) with respect to the total amount of polymerizable compounds among the compounds shown in the table. The resultant was subjected to two-stage filtration with a polytetrafluoroethylene (PTFE) filter having a pore size of 0.1 μm and a UPE filter having a pore size of 0.003 μm to prepare a curable composition for imprinting.

<Measurement of Surface Free Energy>

Surface free energy of the film formed of the composition for forming an underlayer film for imprinting was measured at 23° C. using a surface tensiometer SURFACE TENSIOMETER CBVP-A3 manufactured by Kyowa Interface Science Co., LTD. and a glass plate (glass plate manufactured by Kyowa Interface Science Co., LTD.). Two samples were prepared for one level and were respectively measured three times. An arithmetic mean value of a total of six times was adopted as an evaluation value. The film formation was performed in the same manner as in evaluation of wettability described below.

<Calculation of Distance (ΔHSP) Between Hansen Solubility Parameters>

The Hansen solubility parameter was calculated with HSP calculation software HSPiP.

Respective components (Δd, Δp, and Δh) of the Hansen solubility parameter vector were calculated by inputting structural formulae of each compound and the partial structure B in a SMILES format into the above software. The distance (ΔHSP) between Hansen solubility parameters was calculated by applying the calculated Hansen solubility parameter to the following expression.

$$\Delta HSP = (4.0 \times (\Delta d^2 + \Delta p^2 + \Delta h^2))^{0.5}$$

In a case where there were a plurality of compounds in each component to be calculated, as the Hansen solubility parameter, a value for a component with the largest amount among the compounds was adopted. In a case where there were two kinds of components with the largest amount, an average value based on a mixing ratio of the two kinds thereof was used.

<Method for Measuring Molecular Weight>

A weight-average molecular weight (Mw) of the resin was defined as a value in terms of polystyrene according to gel permeation chromatography (GPC measurement). HLC-8220 (manufactured by TOSOH CORPORATION) was used as a device, and GUARD COLUMN HZ-L, TSKgel Super HZM-M, TSKgel Super HZ4000, TSKgel Super HZ3000, and TSKgel Super HZ2000 (manufactured by TOSOH CORPORATION) were used as columns. As an eluent, tetrahydrofuran (THF) was used. For detection, a detector of UV rays (ultraviolet rays) having a wavelength of 254 nm was used.

<Adhesiveness>

An adhesive force between the underlayer film and the resist (curable composition for imprinting) was evaluated as follows.

A spin on carbon (SOC) surface formed on a silicon wafer was spin-coated with the composition for forming an underlayer film for imprinting, and heated on a hot plate at 200° C. 1 minute to dry a solvent, thereby forming an underlayer film. A thickness of the underlayer film after curing was 5 nm.

The curable composition for imprinting whose temperature was adjusted to 25° C. was jetted in a liquid droplet amount of 1 pL per nozzle to the surface of the underlayer film provided on the SOC using an ink jet printer DMP-2831 manufactured by FUJIFILM Dimatix Inc., and liquid droplets were applied on the underlayer film in a square array with intervals of about 100 μm.

From above, a quartz mold (rectangular line/space pattern (1/1), line width of 40 nm, groove depth of 100 nm, line edge roughness of 3.5 nm) was placed so as to be in contact with the layer of the curable composition for imprinting, and exposure was performed from a quartz wafer side using a high-pressure mercury lamp under a condition of 300 mJ/cm. After the exposure, the quartz wafer was released, and a peeling force at that time was measured.

This peeling force corresponds to an adhesive force F (unit: N). The peeling force was measured according to the method for measuring a peeling force, which is described in Comparative Examples described in paragraph Nos. 0102 to 0107 of JP2011-206977A. That is, the measurement was performed according to the peeling steps 1 to 6 and 16 to 18 in FIG. 5 of the above publication.

A: F≥45N
B: 45N>F≥30N
C: 30N>F≥20N
D: 20N>F

<Evaluation of Wettability>

An underlayer film was formed in the same manner as in the above adhesiveness test. A thickness of the underlayer film after curing was 5 nm.

The curable composition for imprinting shown in Table 4 was jetted in a liquid droplet amount of 6 pL per nozzle to the surface of the underlayer film obtained above using an ink jet printer DMP-2831 manufactured by FUJIFILM Dimatix Inc., and liquid droplets were applied on the surface of the underlayer film in a square array with intervals of about 880 μm. At this time, the temperature of the curable composition for imprinting was adjusted to 23° C. A shape of the liquid droplet was imaged 3 seconds after the application, and a diameter of the liquid droplet was measured. Two samples were used for one level and were respectively measured three times. An arithmetic mean value of a total of six times was adopted as an evaluation value. The results are shown in Table 5.

A: Average diameter of J liquid droplets >500 μm
B: 400 μm<average diameter of IJ liquid droplets ≤500 μm
C: 320 μm<average diameter of IJ liquid droplets ≤400 μm
D: Average diameter of IJ liquid droplets ≤320 μm <Evaluation of Film Thickness Uniformity>

A film thickness of the surface of the underlayer film obtained by the procedure described in the above adhesiveness test was measured using an ellipsometer (irradiation spot diameter: 30 μm×90 μm). The measurement was performed at 30 points on the surface of the underlayer film on the same wafer, and film thickness uniformity (3σ) of the surface of the underlayer film was calculated, and evaluated according to the following standards.

A: 3σ≤1.5
B: 1.5<3σ≤3.0
C: 3.0<3σ≤54.5
D: 4.5<3σ

<Defect>

Defects in the obtained pattern were evaluated as follows.

A spin on carbon (SOC) surface formed on a silicon wafer was spin-coated with the composition for forming an underlayer film for imprinting, and heated on a hot plate at 200° C. 1 minute to dry a solvent, thereby forming an underlayer film. A thickness of the underlayer film after curing was 5 nm.

The curable composition for imprinting whose temperature was adjusted to 25° C. was jetted in a liquid droplet amount of 1 pL per nozzle to the surface of the underlayer film obtained above using an ink jet printer DMP-2831 manufactured by FUJIFILM Dimatix Inc., and liquid droplets were applied on the underlayer film in a square array with intervals of about 100 μm, thereby forming a pattern forming layer. Subsequently, a quartz mold (rectangular line/space pattern (1/1), line width of 40 nm, groove depth of 100 nm, line edge roughness of 3.5 nm) was pressed against the pattern forming layer to fill the mold with the pattern forming layer (curable composition for imprinting). Moreover, after exposure was performed from a mold side using a high-pressure mercury lamp under a condition of 300 mJ/cm², the mold was peeled off to transfer a pattern to the pattern forming layer.

Failure of the pattern forming layer was evaluated by observing the pattern transferred to the pattern forming layer using an optical microscope (STM6-LM manufactured by OLYMPUS CORPORATION).

A: Failure occurred in less than 1% of the entire pattern area.
B: Peeling failure occurred in 1% or more of the entire pattern area.

TABLE 1

| Composition for forming underlayer film | Weight-average molecular weight | Example 1 | Example 2 | Example 3 | Example 4 | Example 5 | Example 6 | Example 7 | Example 8 | Example 9 | Example 10 | Example 11 | Formula weight of partial structure B | HSP d component | HSP p component | HSP h component |
|---|---|---|---|---|---|---|---|---|---|---|---|---|---|---|---|---|
| Resin G-1 | 12000 | 2.0 | | | | | | | | | | | 192.17 | 18.1 | 10.3 | 12.3 |
| Resin G-2 | 20000 | | 2.0 | | | | | | | | | | 236.22 | 16.5 | 8.3 | 9.1 |
| Resin G-3 | 16000 | | | 2.0 | | | | | | | | | 245.25 | 19.0 | 5.2 | 6.7 |
| Resin G-4 | 30000 | | | | 2.0 | | | | | | | | 163.2 | 18.6 | 6.8 | 9.3 |
| Resin G-5 | 50000 | | | | | 2.0 | | | | | | | 263.23 | 18.2 | 8.3 | 9.1 |
| Resin G-6 | 150000 | | | | | | 2.0 | | | | | | 183.61 | 18.3 | 5.8 | 11.5 |
| Resin G-7 | 20000 | | | | | | | 2.0 | | | | | 205.28 | 18.3 | 5.8 | 11.5 |
| Resin G-8 | 20000 | | | | | | | | 2.0 | | | | 262.22 | 18.0 | 7.8 | 84 |
| Resin G-9 | 16000 | | | | | | | | | 2.0 | | | 262.22 | 18.0 | 7.8 | 8.4 |
| Resin G-10 | 19000 | | | | | | | | | | 2.0 | | 263.23 | 18.2 | 8.3 | 9.1 |
| Resin G-11 | 8000 | | | | | | | | | | | 2.0 | 173.19 | 17.9 | 4.2 | 5.7 |
| PGMEA | — | 98.0 | 98.0 | 98.0 | 98.0 | 98.0 | 98.0 | 98.0 | 98.0 | 98.0 | 98.0 | 98.0 | | | | |
| Surface free energy | — | 48.1 | 65.2 | 41.0 | 44.2 | 25.5 | 43.0 | 70.8 | 45.3 | 41.1 | 40.0 | 42.1 | | | | |
| Curable composition for imprinting | — | R-3 | R-3 | R-5 | R-4 | R-3 | R-5 | R-6 | R-3 | R-3 | R-3 | R-5 | | | | |

TABLE 1-continued

| Composition for forming underlayer film | Weight-average molecular weight | Example 1 | Example 2 | Example 3 | Example 4 | Example 5 | Example 6 | Example 7 | Example 8 | Example 9 | Example 10 | Example 11 | Formula weight of partial structure B | HSP d component | HSP p component | HSP h component |
|---|---|---|---|---|---|---|---|---|---|---|---|---|---|---|---|---|
| ΔHSP | — | 4.11 | 2.09 | 0.53 | 1.70 | 0.53 | 5.76 | 5.11 | 0.95 | 0.95 | 0.53 | 0.54 | | | | |
| Common ratio | — | 72.7 | 89.4 | 99.6 | 73.4 | 99.6 | 74.6 | 62.1 | 99.2 | 99.2 | 99.6 | 65.5 | | | | |

All units of formulation amounts are parts by mass
PGMEA: Propylene glycol monomethyl ether acetate
PGME: Propylene glycol monomethyl ether
HSP: Hansen solubility parameter of the partial structure B
(in a case of Comparative Examples 1 and 3, a value of the partial structure containing no aromatic ring)
Surface free energy: Surface free energy of the film formed of the composition for forming an underlayer film for imprinting
ΔHSP: ΔHSP derived from the Hansen solubility parameter of the polymerizable compound and the Hansen solubility parameter of the partial structure B of the polymer
Common ratio: Ratio in which the polymerizable compound and the partial structure B of the polymer are common (unit is % by mass)

TABLE 2

| Composition for forming underlayer film | Weight-average molecular weight | Example 12 | Example 13 | Example 14 | Example 15 | Example 16 | Example 17 | Example 18 | Example 19 | Example 20 | Example 21 | Example 22 | Formula weight of partial structure B | HSP d component | HSP p component | HSP h component |
|---|---|---|---|---|---|---|---|---|---|---|---|---|---|---|---|---|
| Resin G-11 | 8000 | | | | | | | 2.0 | | | | | 173.19 | 17.9 | 4.2 | 5.7 |
| Resin G-12 | 750000 | 2.0 | | | | | | | | | | | 205.19 | 18.8 | 6.0 | 9.1 |
| Resin G-13 | 55000 | | 2.0 | | | | | | | | | | 165.21 | 19.2 | 5.7 | 9.5 |
| Resin G-14 | 50000 | | | 2.0 | | | | | | | | | 195.15 | 18.1 | 7.7 | 10.9 |
| Resin G-15 | 12000 | | | | 2.0 | | | | | | | | 183.2 | 18.8 | 6.2 | 12.8 |
| Resin G-16 | 35000 | | | | | 2.0 | | | | | | | 188.23 | 18.1 | 4.5 | 5.9 |
| Resin G-17 | 25000 | | | | | | 2.0 | | | | | | 245.25 | 18.1 | 4.5 | 5.9 |
| Resin G-18 | 22000 | | | | | | | | 2.0 | 2.0 | | | 367.42 | 17.8 | 5.9 | 7.6 |
| Resin G-19 | 12000 | | | | | | | | | | 2.0 | | 150.16 | 18.6 | 8.0 | 9.3 |
| Resin G-20 | 30000 | | | | | | | | | | | 2.0 | 196.14 | 18.1 | 9.9 | 11.1 |
| PGMEA | — | 48.0 | 98.0 | 98.0 | 98.0 | 98.0 | 98.0 | | 98.0 | 98.0 | 98.0 | 98.0 | | | | |
| PGME | — | 50.0 | | | | | | 68.0 | | | | | | | | |
| EL | — | | | | | | | 30.0 | | | | | | | | |
| Surface free energy | — | 41.8 | 62.8 | 48.8 | 40.3 | 44.5 | 41.0 | 42.1 | 41.6 | 41.6 | 42.2 | 43.8 | | | | |
| Curable composition for imprinting | — | R-6 | R-5 | R-9 | R-8 | R-5 | R-6 | R-13 | R-1 | R-2 | R-7 | R-10 | | | | |
| ΔHSP | — | 3.19 | 4.39 | 4.26 | 5.22 | 2.40 | 0.67 | 0.78 | 2.02 | 2.85 | 0.81 | 4.15 | | | | |
| Common ratio | — | 62.1 | 67.1 | 82.6 | 76.4 | 74.2 | 78.4 | 61.4 | 78.4 | 74.0 | 63.8 | 87.9 | | | | |

All units are parts by mass
EL: Ethyl lactate
For others, refer to the notes in Table 1

TABLE 3

| Composition for forming underlayer film | Weight-average molecular weight | Example 23 | Example 24 | Example 25 | Example 26 | Example 27 | Example 28 | Example 29 | Comparative Example 1 | Comparative Example 2 | Comparative Example 3 | Comparative Example 4 | Formula weight of partial structure B | HSP d component | HSP p component | HSP h component |
|---|---|---|---|---|---|---|---|---|---|---|---|---|---|---|---|---|
| Resin G-1 | 12000 | | | 0.1 | 5.0 | 10.0 | 35.0 | | | | | | 192.17 | 18.1 | 10.3 | 12.3 |
| Resin G-21 | 50000 | 2.0 | | | | | | | | | | | 184.13 | 18.6 | 15.2 | 9.6 |

TABLE 3-continued

| Composition for forming underlayer film | Weight-average molecular weight | Example 23 | Example 24 | Example 25 | Example 26 | Example 27 | Example 28 | Example 29 | Comparative Example 1 | Comparative Example 2 | Comparative Example 3 | Comparative Example 4 | Formula weight of partial structure B | HSP d component | HSP p component | HSP h component |
|---|---|---|---|---|---|---|---|---|---|---|---|---|---|---|---|---|
| Resin G-22 | 40000 | | 2.0 | | | | | | | | | | 210.23 | 18.6 | 6.8 | 8.3 |
| Resin G-23 | 30000 | | | | | | | 0.3 | | | | | 205.19 | 18.8 | 6.0 | 9.1 |
| Resin H-1 | 24000 | | | | | | | | 2.0 | | | | 71.06 | 16.2 | 7.9 | 15.5 |
| Resin H-2 | 50000 | | | | | | | | | 2.0 | | | 77.11 | 18.5 | 4.5 | 5.5 |
| Resin H-3 | 3900 | | | | | | | | | | 2.0 | | 169.16 | 17.8 | 8.3 | 17.4 |
| Resin H-4 | 25000 | | | | | | | | | | | 2.0 | 121.12 | 19.2 | 5.7 | 9.5 |
| PGMEA | — | 98.0 | 98.0 | 99.9 | 95.0 | 90.0 | 65.0 | 99.7 | 98.0 | 98.0 | 98.0 | 98.0 | | | | |
| Surface free energy | — | 46.2 | 43.1 | 48.1 | 48.1 | 48.1 | 48.1 | 41.8 | 60.5 | 42.3 | 46.2 | 54.8 | | | | |
| Curable composition for imprinting | — | R-11 | R-12 | R-3 | R-3 | R-3 | R-3 | R-6 | R-1 | R-1 | R-1 | R-1 | | | | |
| ΔHSP | | 6.03 | 3.00 | 3.78 | 3.78 | 3.78 | 3.78 | 3.19 | 10.58 | 2.00 | 12.08 | 4.92 | | | | |
| Common ratio | | 63.2 | 71.2 | 72.7 | 72.7 | 72.7 | 72.7 | 62.1 | 15.2 | 16.5 | 36.1 | 25.8 | | | | |

All units are parts by mass
For others, refer to the notes in Table 1

TABLE 4

| Curable composition for imprinting | R-1 | R-2 | R-3 | R-4 | R-5 | R-6 | R-7 | R-8 | R-9 | R-10 | R-11 | R-12 | R-13 |
|---|---|---|---|---|---|---|---|---|---|---|---|---|---|
| Polymerizable compound A-1 | 60.0 | | | | | | | | | | | | |
| Polymerizable compound A-2 | | 60.0 | | | | | | | | | | | |
| Polymerizable compound A-3 | | | 60.0 | | | | | | | | | | |
| Polymerizable compound A-4 | | | | 60.0 | | | | | | | | | |
| Polymerizable compound A-5 | | | | | 60.0 | | | | | | | | 30.0 |
| Polymerizable compound A-6 | | | | | | 60.0 | | | | | | | 30.0 |
| Polymerizable compound A-7 | | | | | | | 60.0 | | | | | | |
| Polymerizable compound A-8 | | | | | | | | 60.0 | | | | | |
| Polymerizable compound A-9 | | | | | | | | | 60.0 | | | | |
| Polymerizable compound A-10 | | | | | | | | | | 80.0 | | | |
| Polymerizable compound A-11 | | | | | | | | | | | 85.0 | | |
| Polymerizable compound A-12 | | | | | | | | | | | | 90.0 | |
| Polymerizable compound B-1 | 35.0 | | | | | | | | | | | | 20.0 |
| Polymerizable compound B-2 | | 30.0 | | 32.0 | | | | 10.0 | 25.0 | | | | |
| Polymerizable compound B-3 | | 30.0 | | | 35.0 | 25.0 | 28.0 | 8.0 | | | | | |
| Polymerizable compound B-4 | | | | | | | | | | 15.0 | | 5.0 | |
| Polymerizable compound B-5 | | | | | | | | | | 10.0 | | | 10.0 |
| Polymerization initiator C-1 | 3.0 | | | | | 3.0 | | | | | | | 1.0 |
| Polymerization initiator C-2 | | 3.0 | | 3.0 | | 3.0 | | 1.5 | | 3.5 | 4.0 | | |
| Polymerization initiator C-3 | | | 3.0 | | | | | | 2.0 | | 0.5 | | |
| Polymerization initiator C-4 | | | 3.0 | | | | | 1.5 | | | | | |
| Additive D-1 | 2.0 | | | | 2.0 | 2.0 | | | | | 2.5 | | 2.0 |
| Additive D-2 | | 2.0 | 7.0 | 2.0 | | | 5.0 | 2.0 | 13.0 | 1.5 | | 2.0 | |
| Additive D-3 | | | 5.0 | | | 2.0 | 10.0 | | 10.0 | | 2.0 | | 5.0 |
| Additive D-4 | | | | 3.0 | | | 2.0 | 7.0 | | 1.0 | | | |

All units are parts by mass

TABLE 5

| | Adhesiveness | Weltability | Film thickness uniformity | Application defect |
|---|---|---|---|---|
| Example 1 | A | A | A | A |
| Example 2 | A | B | A | A |
| Example 3 | A | A | A | A |
| Example 4 | A | A | A | A |
| Example 5 | B | A | A | A |
| Example 6 | A | A | A | A |
| Example 7 | A | B | A | A |
| Example 8 | A | A | A | A |
| Example 9 | A | A | A | A |
| Example 10 | A | A | A | A |
| Example 11 | A | A | B | A |
| Example 12 | A | A | A | A |

TABLE 5-continued

| | Adhesiveness | Weltability | Film thickness uniformity | Application defect |
|---|---|---|---|---|
| Example 13 | A | A | A | A |
| Example 14 | A | A | A | A |
| Example 15 | A | A | A | A |
| Example 16 | A | A | A | A |
| Example 17 | A | A | A | A |
| Example 18 | A | A | A | A |
| Example 19 | A | A | A | A |
| Example 20 | A | A | A | A |
| Example 21 | A | A | A | A |
| Example 22 | A | A | A | A |
| Example 23 | A | A | A | A |
| Example 24 | A | A | A | A |
| Example 25 | A | A | A | A |
| Example 26 | A | A | A | A |
| Example 27 | A | A | A | A |
| Example 28 | A | A | A | A |
| Example 29 | A | A | A | A |
| Comparative Example 1 | A | D | A | B |
| Comparative Example 2 | A | D | A | A |
| Comparative Example 3 | A | D | D | A |
| Comparative Example 4 | D | B | A | A |

Hansen solubility parameter (HSP) of polymerizable compound

TABLE 6

| | HSP | | |
|---|---|---|---|
| | d component | p component | h component |
| A-1 | 17.7 | 5.7 | 5.6 |
| A-2 | 17.5 | 5.2 | 4.9 |
| A-3 | 18.2 | 8.3 | 9.1 |
| A-4 | 18.0 | 6.9 | 10.5 |
| A-5 | 18.1 | 4.5 | 5.9 |
| A-6 | 18.1 | 4.8 | 6.5 |
| A-7 | 18.3 | 7.5 | 9.1 |
| A-8 | 18.3 | 4.7 | 7.9 |
| A-9 | 17.4 | 5.9 | 7.3 |
| A-10 | 17.7 | 8.0 | 7.5 |
| A-11 | 18.2 | 10.5 | 5.9 |
| A-12 | 18.0 | 5.3 | 6.0 |
| B-1 | 16.5 | 5.0 | 6.7 |
| B-2 | 16.2 | 4.1 | 5.7 |
| B-3 | 17.0 | 5.1 | 7.4 |
| B-4 | 16.1 | 2.6 | 3.4 |
| B-5 | 17.9 | 4.2 | 5.7 |

<Polymerizable Compound>

Exemplary compounds A-1 to A-12 described above

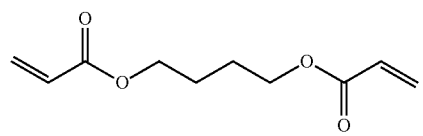

B-1

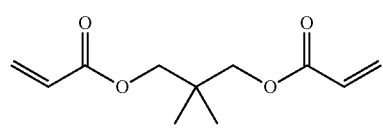

B-2

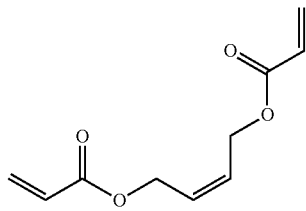

B-3

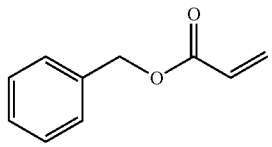

B-4

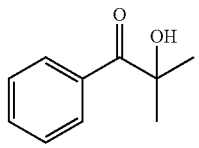

B-5

<Polymerization Initiator>

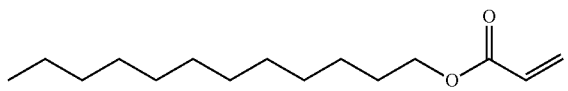

C-1

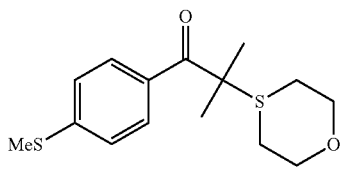

C-2

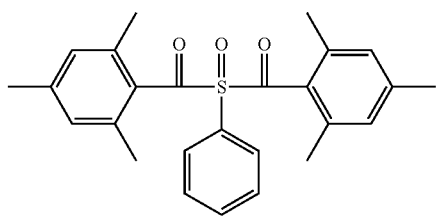

C-3

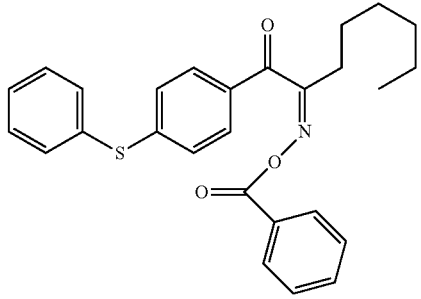

C-4

Me: Methyl group

<Additive>

| | |
|---|---|
| Fluorine-based surfactant (Capstone FS-3100) | D-1 |
| 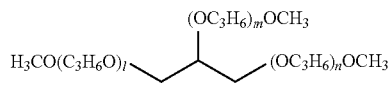 | D-2 |
| 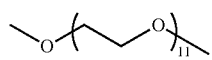 | D-3 |
| 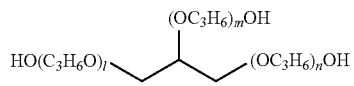 | D-4 |

D-1 is a trade name (manufactured by DuPont)
D-2 has a weight-average molecular weight (Mw) of 800
D-4 has a weight-average molecular weight (Mw) of 800

<Specific Polymer>

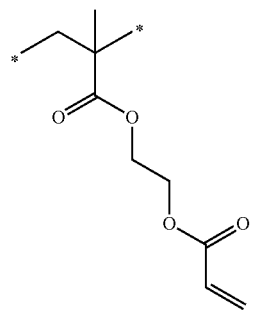  G-1

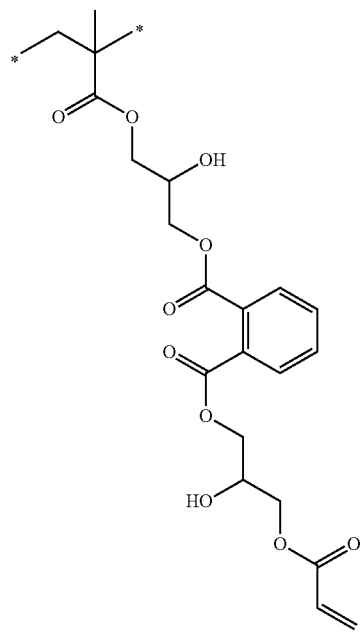

A copolymerization ratio (molar ratio, the same applies to the following copolymerization ratios) between constitutional units on a left side and a right side of the resin G-1 is 50:50.

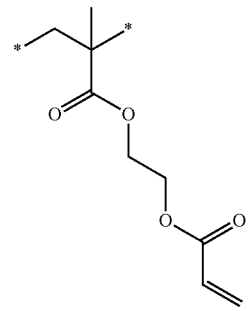  G-2

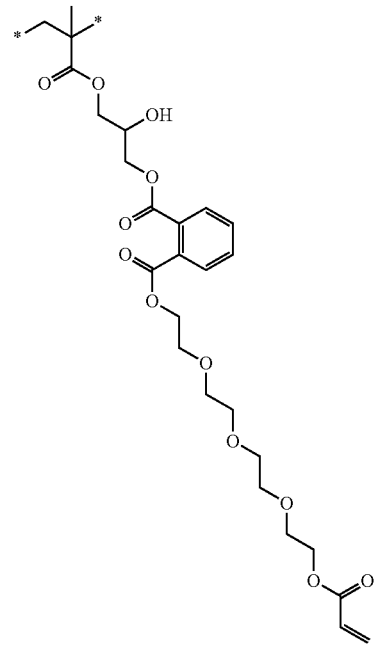

A copolymerization ratio between constitutional units on a left side and a right side of the resin G-2 is 50:50.

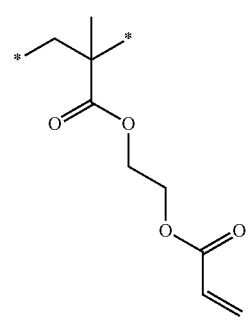  G-3

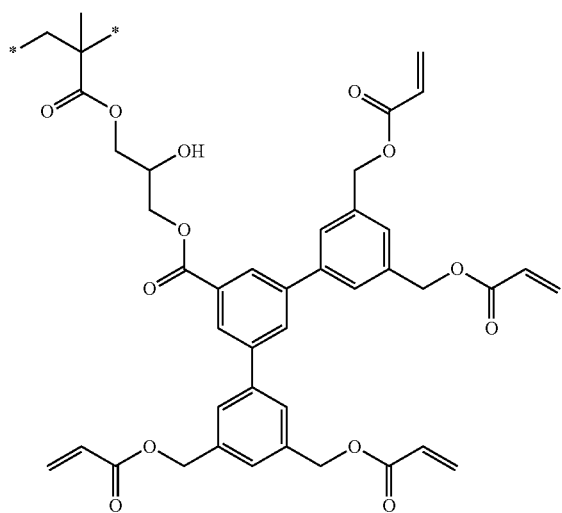

G-3

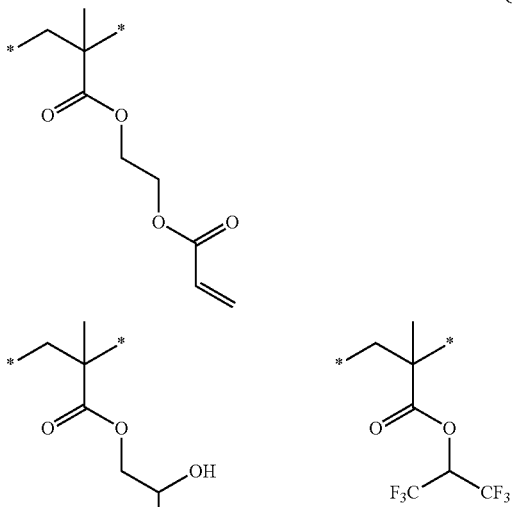

G-5

A copolymerization ratio among constitutional units on a left side and a right side of the resin G-3 is 50:50.

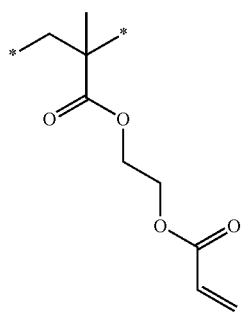

G-4

A copolymerization ratio among constitutional units on a left side, a center, and a right side of the resin G-5 is 25:50:25.

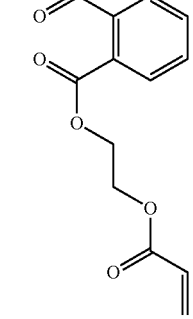

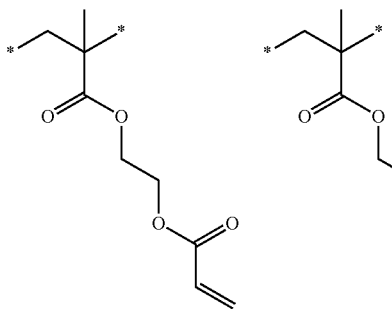

G-6

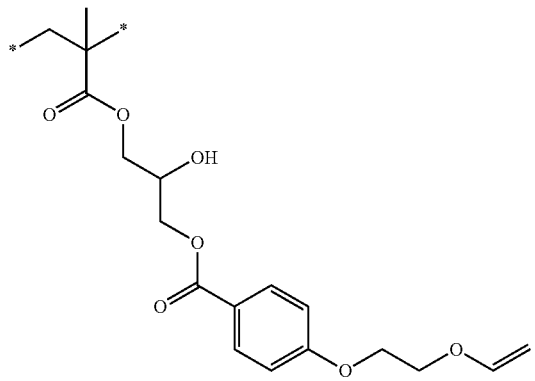

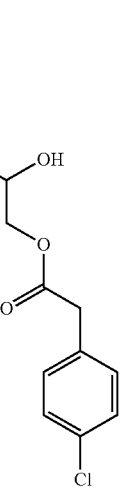

A copolymerization ratio between constitutional units on a left side and a right side of the resin G-4 is 50:50.

A copolymerization ratio between constitutional units on a left side and a right side of the resin G-6 is 50:50.

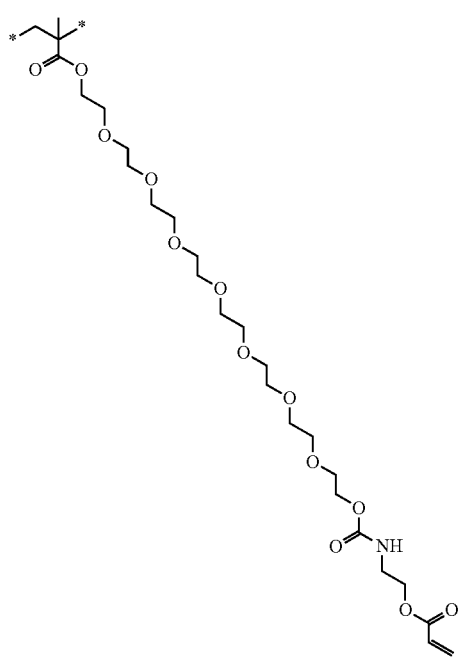
G-7
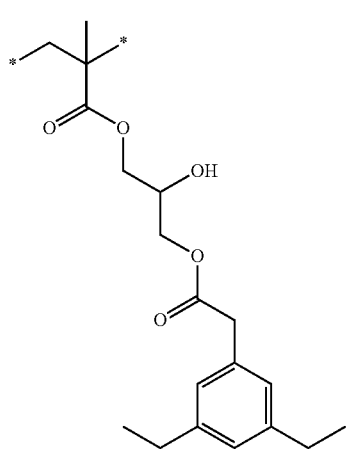
A copolymerization ratio between constitutional units on a left side and a right side of the resin G-7 is 20:80.
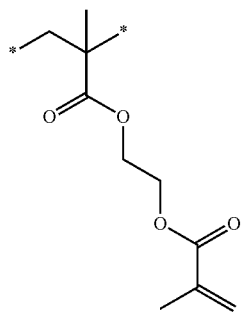
G-8
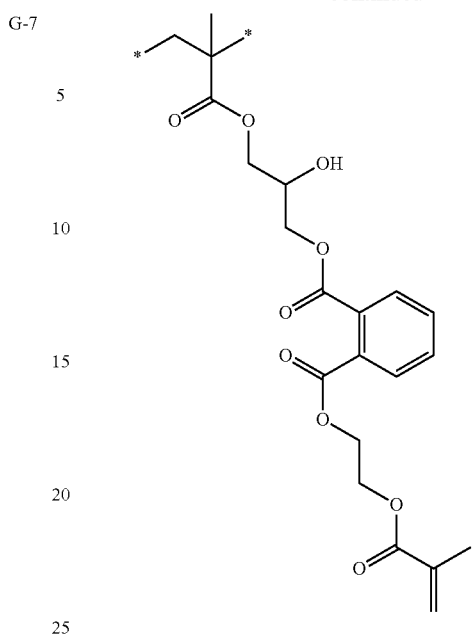
A copolymerization ratio between constitutional units on a left side and a right side of the resin G-8 is 50:50.
G-9
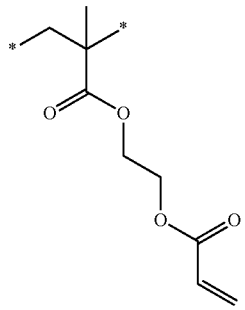
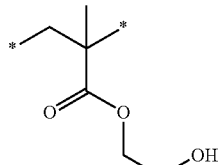
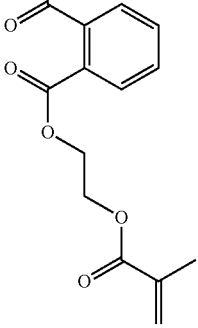

A copolymerization ratio between constitutional units on a left side and a right side of the resin G-9 is 50:50.
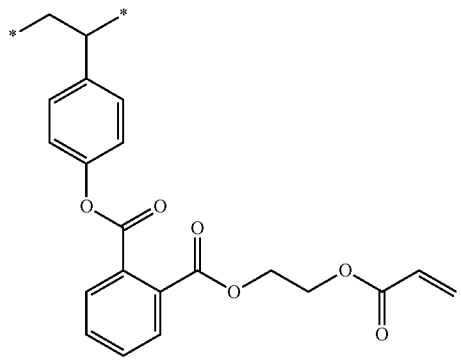
G-10
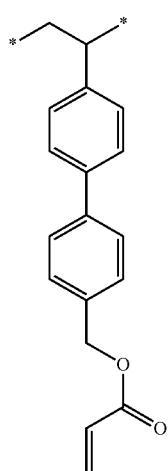
G-11
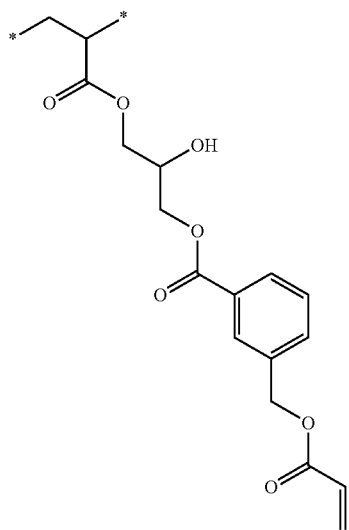
G-12
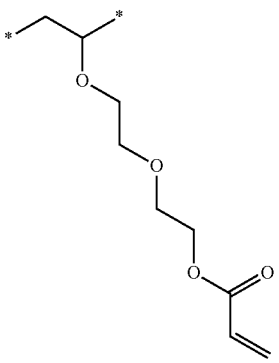
G-13
A copolymerization ratio between constitutional units on a left side and a right side of the resin G-13 is 60:40.
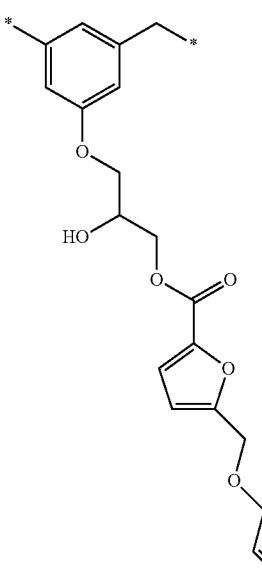
G-14

G-15
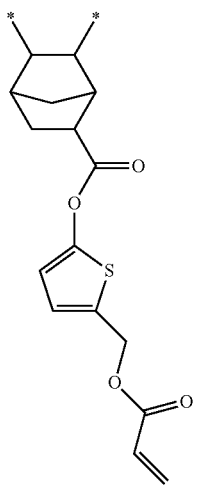
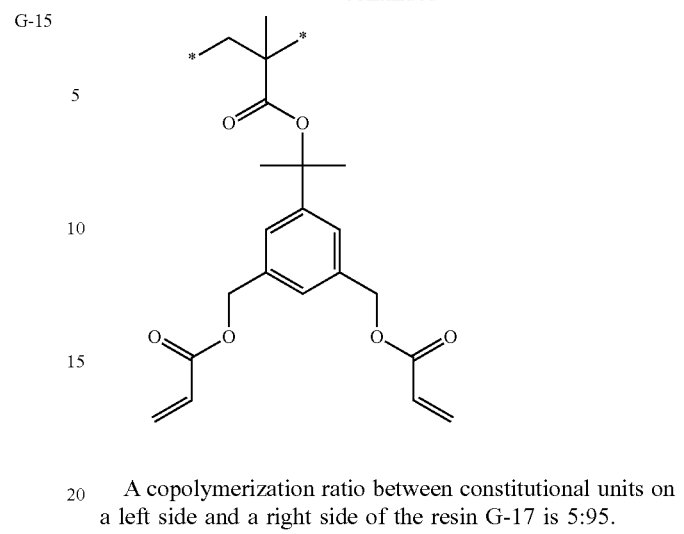
A copolymerization ratio between constitutional units on a left side and a right side of the resin G-17 is 5:95.
G-16
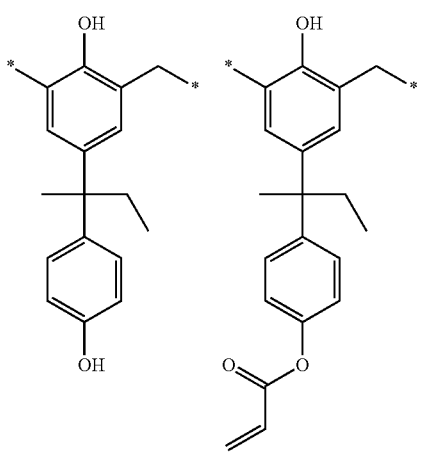
A copolymerization ratio between constitutional units on a left side and a right side of the resin G-16 is 15:85.
G-17
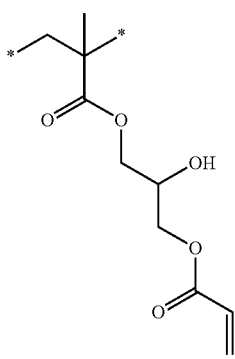 [SMILES: *CC(*)(C)C(=O)OCC(O)COC(=O)C=C]
G-18
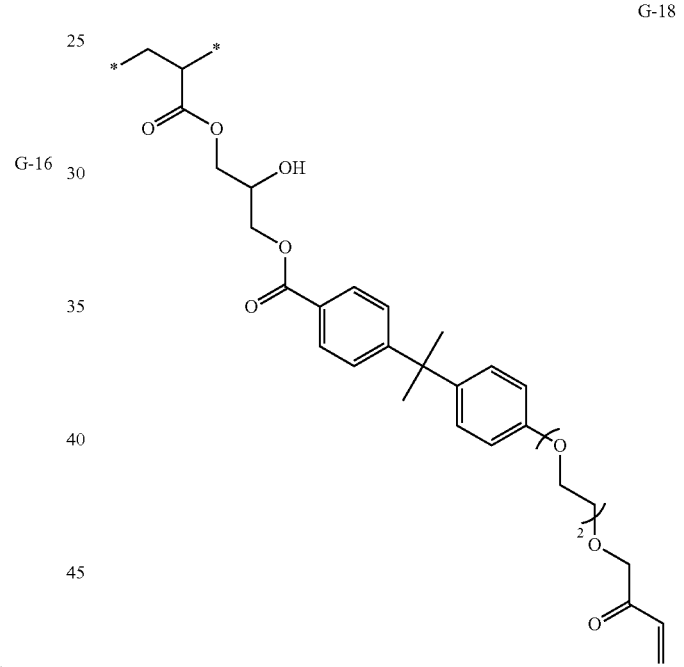
G-19
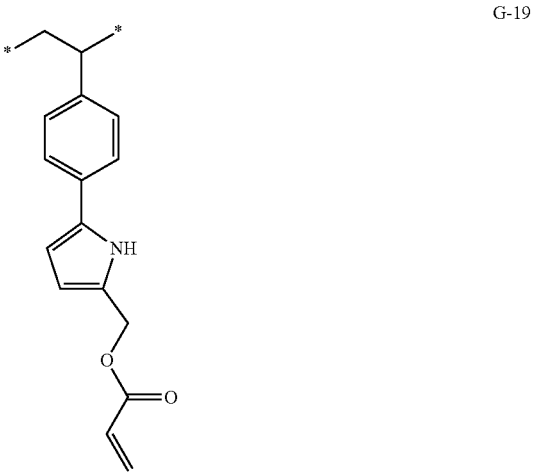

G-20
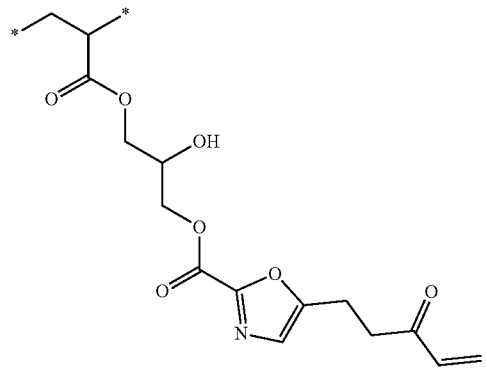
G-21
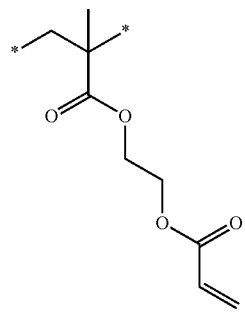
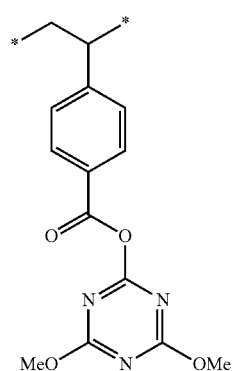
G-22
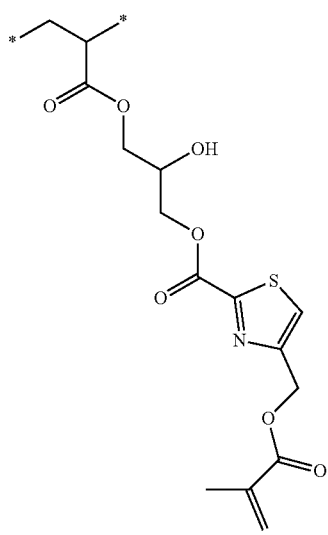
G-23
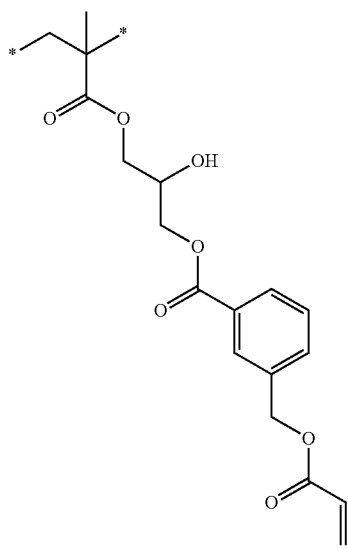
H-1
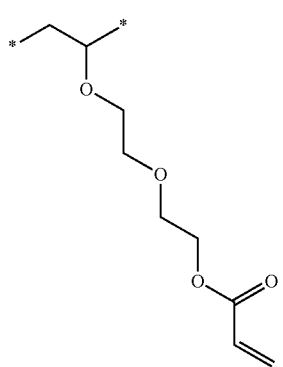
A copolymerization ratio between constitutional units on a left side and a right side of the resin G-21 is 10:90.
Me: Methyl group

H-2

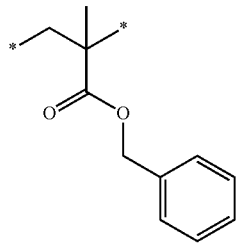

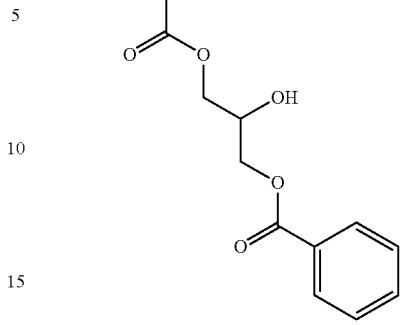

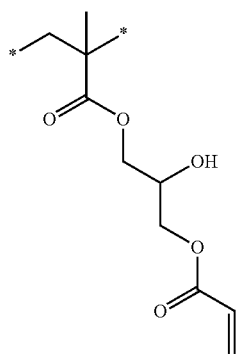

A copolymerization ratio between constitutional units on a left side and a right side of the resin H-2 is 50:50.

H-3

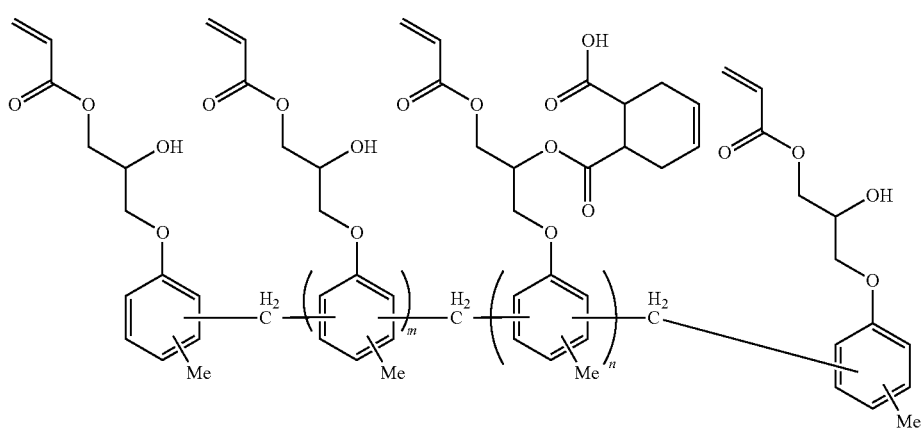

Average m+n=1, Average n/(m+n)=0.5

NK OLIGO EA-7440 manufactured by Shin-Nakamuma Chemical Co., Ltd.

Me: Methyl group

As is clear from the above results, it was found that by using the kit according to the embodiment of the present invention, the wettability of the curable composition for imprinting with respect to the film formed of the composition for forming an underlayer film for imprinting was increased and the adhesiveness was increased (Examples 1-1 to 1-28).

On the other hand, it was found that in a case (Comparative Examples 1 and 3) where the polymerizable compound having an aromatic ring was used in the curable composition for imprinting but the polymer used in the composition for forming an underlayer film for imprinting did not have a partial structure in which the aromatic rings were continuous, the wettability was poor. Moreover, in a case (Comparative Example 2) where the polymer had a partial structure in which the aromatic rings are continuous but the ratio in which the partial structure and the structure of the polymerizable compound were common was less than 60% by mass, the wettability was poor. Furthermore, it was found that in a case (Comparative Example 4) where the specific polymer (resin) did not have a polymerizable group, the adhesiveness was poor.

In addition, in the preferred embodiment of the present invention, the uniformity of the coating film of the curable composition for imprinting was excellent, and an occurrence frequency of the application defect of the curable composition for imprinting could also be improved.

A quartz mold with a pattern having a width of 17 nm, 40 nm, or 100 nm was brought into contact with the film of the curable composition for imprinting produced in each Example. Thereafter, ultraviolet rays were radiated from the mold side to cure the film. Subsequently, the mold was separated to obtain a cured product pattern to which the pattern of the mold was transferred. As a result, it was confirmed that a favorable pattern could be formed in all the cured products.

EXPLANATION OF REFERENCES

1: Substrate
2: Underlayer film
3: Curable composition for imprinting
4: Mold
21: Underlayer film
22: Curable composition for imprinting

What is claimed is:

1. A kit comprising:
a curable composition for imprinting which contains a polymerizable compound having an aromatic ring; and
a composition for forming an underlayer film for imprinting which contains a polymer and a solvent,
wherein the polymer contains at least one kind of constitutional unit represented by any one of Formulae (1) to (6) and has a polymerizable group,
a film formed of the composition for forming an underlayer film for imprinting is a solid film at 23° C., and
a continuous partial structure containing an aromatic ring which is included in the polymerizable compound and accounts for 60% by mass or more of the polymerizable compound is common to a continuous partial structure containing an aromatic ring which is included in a substituent $R^2$ in Formulae (1) to (6),

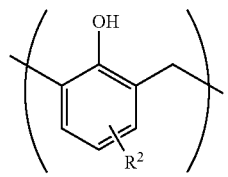

(1)

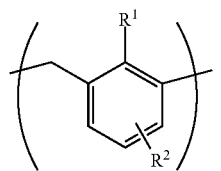

(2)

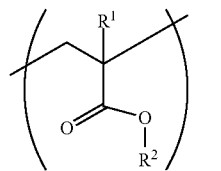

(3)

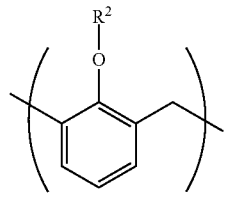

(4)

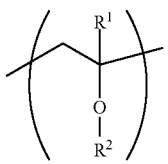

(5)

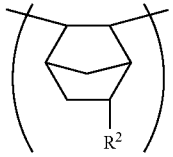

(6)

in Formulae (1) to (6), the substituents R are each independently a substituent having a partial structure containing an aromatic ring, a formula weight of $R^2$ is 80 or more, a substituent $R^1$ is a hydrogen atom or a methyl group, and a main chain of the polymer in Formulae (1) to (6) may have a substituent.

2. The kit according to claim 1,
wherein the following ΔHSP, which is derived from a Hansen solubility parameter of at least one kind of polymerizable compound contained in the curable composition for imprinting and a Hansen solubility parameter of the continuous partial structure containing an aromatic ring which is included in the substituent $R^2$ of the polymer, is 5 or less, $$\Delta HSP=[4.0\times(\Delta d^2+\Delta p^2+\Delta h^2)]^{0.5}$$

where Δd is a difference between a dispersion element component of a Hansen solubility parameter vector of the polymerizable compound and a dispersion element component of a Hansen solubility parameter vector of the continuous partial structure containing an aromatic ring which is included in the substituent $R^2$ of the polymer, Δp is a difference between a polarity element component of the Hansen solubility parameter vector of the polymerizable compound and a polarity element component of the Hansen solubility parameter vector of the continuous partial structure containing an aromatic ring which is included in the substituent $R^2$ of the polymer, and Δh is a difference between a hydrogen bond element component of the Hansen solubility parameter vector of the polymerizable compound and a hydrogen bond element component of the Hansen solubility parameter vector of the continuous partial structure containing an aromatic ring which is included in the substituent $R^2$ of the polymer.

3. The kit according to claim 1,
wherein a formula weight of the continuous partial structure containing an aromatic ring which is included in the substituent $R^2$ of the polymer is 500 or less.

4. The kit according to claim 1,
wherein the polymerizable group included in the polymer is a (meth)acryloyl group.

5. The kit according to claim 1,
wherein surface free energy of an underlayer film for imprinting formed of the composition for forming an underlayer film for imprinting is 40 mN/m or more.

6. The kit according to claim 1,
wherein in the polymer, the continuous partial structure containing an aromatic ring which is included in the substituent $R^2$ in Formulae (1) to (6) includes a polymerizable group.

7. The kit according to claim 1,
wherein the continuous partial structure containing an aromatic ring which is included in the substituent $R^2$ of the polymer is a substituent represented by $-(L^1)_{n1}$-La-$[(L^2)_{n2}$-$(P)_{n3}]_{n4}$,
where $L^1$ and $L^2$ are each independently a linking group containing a heteroatom, provided that in a case where n3 is 0, $L^2$ is a substituent containing a heteroatom; La is a linking group containing an aromatic ring, provided that in a case where n2 is 0 and n3 is 0, La is a substituent containing an aromatic ring; P is a polymerizable group; n1 is 0 to 4; n2 is 0 to 4; n3 is 0 to 6; and n4 is an integer of 1 to 10.

8. The kit according to claim 1,
wherein the polymer is a copolymer having the other constitutional unit different from the constitutional unit having the substituent R, which is represented by any one of Formulae (1) to (6).

9. The kit according to claim 8,
wherein the other constitutional unit of the polymer is represented by any one of Formulae (1-1) to (1-6),

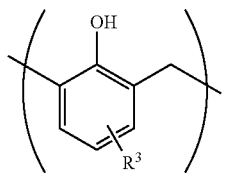 (1-1)

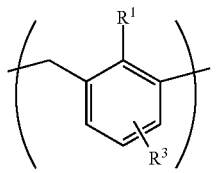 (1-2)

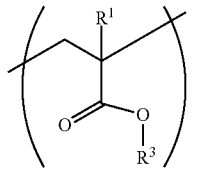 (1-3)

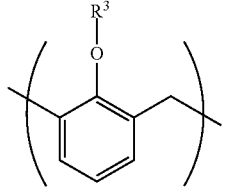 (1-4)

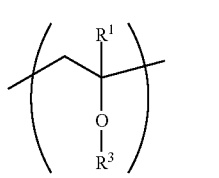 (1-5)

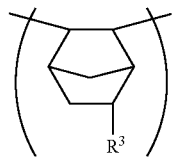 (1-6)

in Formulae (1-1) to (1-6), substituents $R^3$ are each independently a substituent having a polymerizable group, a substituent $R^1$ is a hydrogen atom or a methyl group, and a main chain of the polymer in Formulae (1-1) to (1-6) may have a substituent.

10. The kit according to claim 8,
wherein the constitutional unit having the substituent $R^2$ has a polymerizable group, and the number of linking atoms between a carbon-carbon unsaturated bond of the polymerizable group and the main chain is larger than the number of linking atoms between a carbon-carbon unsaturated bond of a polymerizable group and a main chain in the other constitutional unit.

11. The kit according to claim 1,
wherein the formula weight of the substituent $R^2$ is 500 or less.

12. A laminate, which is formed from the kit according to claim 1, comprising:
an underlayer film formed of the composition for forming an underlayer film for imprinting; and
an imprint layer which is formed of the curable composition for imprinting and is positioned on a surface of the underlayer film.

13. A method for producing a laminate using the kit according to claim 1, the method comprising:
applying a curable composition for imprinting onto a surface of an underlayer film formed of the composition for forming an underlayer film for imprinting.

14. The method for producing a laminate according to claim 13,
wherein the curable composition for imprinting is applied onto the surface of the underlayer film by an ink jet method.

15. The method for producing a laminate according to claim 13, further comprising:
a step of applying the composition for forming an underlayer film for imprinting in a layer form onto a substrate; and
heating the composition for forming an underlayer film for imprinting applied in a layer form at 80° C. to 250° C.

16. A method for producing a cured product pattern using the kit according to claim 1, the method comprising:
an underlayer film formation step of applying a composition for forming an underlayer film for imprinting onto a substrate to form an underlayer film;
an application step of applying a curable composition for imprinting onto a surface of the underlayer film;
a mold contact step of bringing the curable composition for imprinting into contact with a mold having a pattern for transferring a pattern shape;
a light irradiation step of irradiating the curable composition for imprinting with light to form a cured product; and
a release step of separating the mold from the cured product.

17. A method for manufacturing a circuit board, comprising:
a step of obtaining a cured product pattern by the production method according to claim 16.

18. A composition for forming an underlayer film for imprinting, which is used in combination with a curable composition for imprinting that contains a polymerizable compound having an aromatic ring, the composition comprising:
the polymer which contains at least one kind of constitutional unit represented by any one of Formulae (1) to (6) and has a polymerizable group,
wherein a film formed of the composition for forming an underlayer film for imprinting is a solid film at 23° C., and
60% by mass or more of a continuous partial structure containing an aromatic ring which is included in the polymerizable compound is common to a continuous partial structure containing an aromatic ring which is included in a substituent $R^2$ in Formulae (1) to (6),

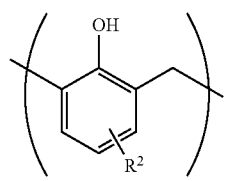

(1)

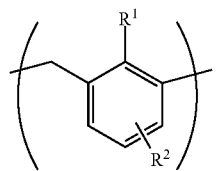

(2)

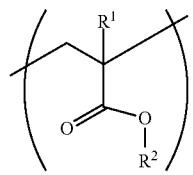

(3)

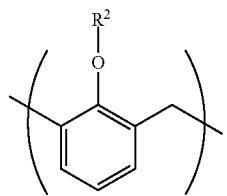

(4)

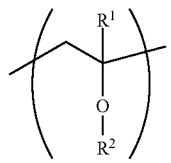

(5)

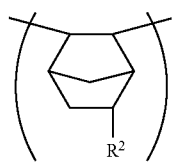

(6)

in Formulae (1) to (6), the substituents $R^2$ are each independently a substituent having a partial structure containing an aromatic ring, a formula weight of $R^2$ is 80 or more, a substituent $R^1$ is a hydrogen atom or a methyl group, and a main chain of the polymer in Formulae (1) to (6) may have a substituent.

19. The composition for forming an underlayer film for imprinting according to claim 18,
wherein the continuous partial structure containing an aromatic ring which is included in the substituent $R^2$ of the polymer is a substituent represented by $-(L^1)_{n1}$-La-$[(L^2)_{n2}$-$(P)_{n3}]_{n4}$,
where $L^1$ and $L^2$ are each independently a linking group containing a heteroatom, provided that in a case where n3 is 0, $L^2$ is a substituent containing a heteroatom; La is a linking group containing an aromatic ring, provided that in a case where n2 is 0 and n3 is 0, La is a substituent containing an aromatic ring; P is a polymerizable group; n1 is 0 to 4; n2 is 0 to 4; n3 is 0 to 6; and n4 is an integer of 1 to 10.

* * * * *